US007504645B2

(12) United States Patent
Anpo et al.

(10) Patent No.: US 7,504,645 B2
(45) Date of Patent: Mar. 17, 2009

(54) METHOD OF FORMING PATTERN WRITING DATA BY USING CHARGED PARTICLE BEAM

(75) Inventors: Akihito Anpo, Tokyo (JP); Hitoshi Higurashi, Kanagawa (JP); Shigehiro Hara, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 195 days.

(21) Appl. No.: 11/678,703

(22) Filed: Feb. 26, 2007

(65) Prior Publication Data

US 2007/0226675 A1 Sep. 27, 2007

(30) Foreign Application Priority Data

Mar. 8, 2006 (JP) .............................. 2006-062046

(51) Int. Cl.
*G06F 19/00* (2006.01)
*G03F 1/00* (2006.01)

(52) U.S. Cl. .............................. 250/492.22; 250/492.2; 250/492.23; 250/492.1; 250/492.3; 250/396 R

(58) Field of Classification Search ............ 250/492.22, 250/492.2, 492.23, 492.3, 492.1, 396 R
See application file for complete search history.

(56) References Cited

U.S. PATENT DOCUMENTS

| 2007/0053242 A1* | 3/2007 | Kasahara et al. ......... 369/13.01 |
| 2008/0046787 A1* | 2/2008 | Anpo et al. ................. 714/701 |
| 2008/0067423 A1* | 3/2008 | Kimura et al. ........... 250/492.1 |
| 2008/0221816 A1* | 9/2008 | Anpo et al. ................... 702/82 |

FOREIGN PATENT DOCUMENTS

| JP | 4-176114 | 6/1992 |
| JP | 11-67648 | 3/1999 |

* cited by examiner

*Primary Examiner*—Nikita Wells
(74) *Attorney, Agent, or Firm*—Oblon, Spivak, McClelland, Maier & Neustadt, P.C.

(57) ABSTRACT

A method of forming pattern writing data to write a predetermined pattern from layout data of a circuit by using a charged particle beam while deflecting the charged particle beam, includes inputting the layout data including a pattern ranging over a plurality of deflection regions, generating a partial pattern which can be deflected in a self region in the ranging pattern for each of the plurality of deflection regions on the basis of the input layout data, and converting layout data including a partial pattern for each of the deflection regions into charged particle beam pattern writing data to output the charged particle beam pattern writing data.

16 Claims, 28 Drawing Sheets

METHOD OF FORMING PATTERN WRITING DATA BY USING CHARGED PARTICLE BEAM

CROSS-REFERENCE TO RELATED APPLICATION

This application is based upon and claims the benefit of priority Japanese Patent Application No. 2006-062046 filed on Mar. 8, 2006 in Japan, the entire contents of which are incorporated herein by reference.

BACKGROUND OF THE INVENTION

1. Field of the Invention

The present invention relates to a method of forming charged particle beam pattern writing data. For example, the present invention relates to a method of forming charged particle beam pattern writing data which forms pattern writing data from layout data of a circuit serving as design data. The pattern writing data is data to write a predetermined pattern while deflecting a charged particle beam.

2. Related Art

A lithography technique which leads development of micropatterning of a semiconductor device is a very important process which uniquely generates a pattern in semiconductor manufacturing processes. In recent years, with high integration of an LSI, a circuit line width required for semiconductor devices progressively decreases year after year. In order to form a desired circuit pattern on the semiconductor devices, a high-definition original pattern (also called a reticle or a mask) is necessary. In this case, an electron beam writing technique has an essentially excellent resolution and is used in production of a high-definition original pattern.

FIG. 31 is a conceptual diagram for explaining an operation of a conventional variable-shaped electron beam photolithography apparatus. A variable-shaped electron beam photolithography apparatus (EB (Electron Beam) writing apparatus) operates as follows. In a first aperture 410, a square, for example, rectangular opening 411 to shape an electron beam 442 is formed. In a second aperture 420, a variable-shaped opening 421 to shape the electron beam 442 having passed through the opening 411 in a desired square shape is formed. The electron beam 442 irradiated from a charged particle source 430 and having passed through the opening 411 is deflected by a deflector. The electron beam 442 passes through a part of the variable-shaped opening 421 and is irradiated on a target object 440 placed on a stage. The stage continuously moves in one predetermined direction (for example, defined as an X direction). More specifically, a square shape which can pass through both the opening 411 and the variable-shaped opening 421 is written in a writing region of the target object 440. A scheme which causes an electron beam to pass through both the opening 411 and the variable-shaped opening 421 to form an arbitrary shape is called a variable shaped beam scheme.

When the electron beam writing is to be performed, first, a layout of a semiconductor integrated circuit is designed. Layout data (design data) is then generated. The layout data is converted to generate pattern writing data for use in an electron beam writing apparatus. On the basis of the pattern writing data, a figure is split into shot sizes to actually shoot an electron beam to perform writing.

A pattern writing region of a target object is virtually split into a plurality of strip-like frame regions each having a deflectable width of a deflector along, for example, a Y direction. Writing is performed on the split frame regions while moving a stage having the target sample placed thereon and causing a single-stage or multi-stage deflector to deflect an electron beam. Upon completion of the writing on the first frame region, the stage moves in the Y direction. Next writing on the second frame region is performed. In this case, writing on the second frame region while moving the stage in an X direction. In this manner, writing is sequentially performed on the respective frame regions.

In this case, with respect to a method for electron beam writing in which a stage moves by a step-and repeat scheme when the stage moves in the X direction within one frame, the following technique is disclosed. More specifically, a pattern is split to eliminate a deviation of a pattern ranging over regions subjected to writing before and after mechanical movement. The technique decreases a dose depending on the number of split patterns (for example, see Published Unexamined Japanese Patent Publication No. 04-176114 (JP-A-04-176114)). A case in which there is a pattern ranging over sub-fields obtained by further splitting a main deflection region having a frame width angle is disclosed as the following technique. More specifically, a boundary position of the sub-fields is changed with reference to the pattern ranging over the sub-fields to prevent the pattern from ranging over the sub-fields (for example, see Published Unexamined Japanese Patent Publication No. 11-67648 (JP-A-11-67648)).

The pattern writing apparatus includes a single-stage or multi-stage deflection region. With respect to an area running out of a deflection region, deflection of a charged particle beam by a deflector does not reach the deflection region to make it impossible to writing. For this reason, when a pattern (for example, cell) ranging over deflection regions is desired to be arranged, the following countermeasure must be taken in formation of layout data. More specifically, a cell must be split in advance so as to prevent the cell from running out of the deflection region, to thereby form layout data. In this case, one cell is defined in a plurality of deflection regions. For this reason, pieces of information and the like of an arrangement position and a size of the cell are necessary. As a result, an amount of the layout data disadvantageously increases.

When there are cells which can be essentially obtained to have an array structure, the following countermeasure must be taken if some or all elements of the cells ranging to another deflection region. More specifically, the cells are purposely developed into arrays and must be defined in deflection regions which are arranged for the respective cells. Accordingly, pieces of information related to the cells are required. As a result, an amount of layout data disadvantageously increases.

As described above, when an amount of the layout data, especially, on the upstream side increases in a data conversion process, time required to convert data increases in the case of converting the layout data into pattern writing data. Furthermore, in addition to this, huge amounts of time are disadvantageously required to transmit the data to a conversion apparatus. In an increase in amount of data with an increase in integration density of LSIs in recent years, the increase in amount of data on the upstream side also influences a throughput of a pattern writing apparatus. When the amount of data is small, time (for example, format check) required to determine correctness of layout data can be reduced.

BRIEF SUMMARY OF THE INVENTION

It is an object of the present invention to provide a method of reducing an amount of layout data.

According to an embodiment of the present invention is a method of forming pattern writing data to write a predetermined pattern from layout data of a circuit by using a charged particle beam while deflecting the charged particle beam, including inputting the layout data including a pattern ranging over a plurality of deflection regions, generating a partial pattern which can be deflected in a self region in the ranging pattern for each of the plurality of deflection regions on the basis of the input layout data, and converting layout data including a partial pattern for each of the deflection regions into charged particle beam pattern writing data to output the charged particle beam pattern writing data.

According to another embodiment of the present invention, there is provided a method of forming pattern writing data to write a predetermined pattern from layout data of a circuit by using a charged particle beam while deflecting the charged particle beam, including inputting the layout data which is defined as a pattern of any one of the plurality of deflection regions and which includes the pattern ranging over the plurality of deflection regions, splitting a pattern portion running out of a position at which deflection can be performed in a self region in the ranging pattern, allocating the split pattern portion as a partial pattern in the deflection region to which the pattern ranges, and after the partial pattern is allocated, converting the layout data into charged particle beam pattern writing data to output the charged particle beam pattern writing data.

DETAILED DESCRIPTION OF THE INVENTION

In the following embodiments, a method of forming charged particle beam pattern writing data for forming pattern writing data or an apparatus therefor will be mainly explained. The pattern writing data is data to write a predetermined pattern by using a charged particle beam from layout data of a circuit while deflecting the charged particle beam. A case of using an electron beam as an example of the charged particle beam will be explained. In this case, the charged particle beam is not limited to an electron beam, and any charged particle beam such as an ion beam may be used.

First Embodiment

Figure 1:
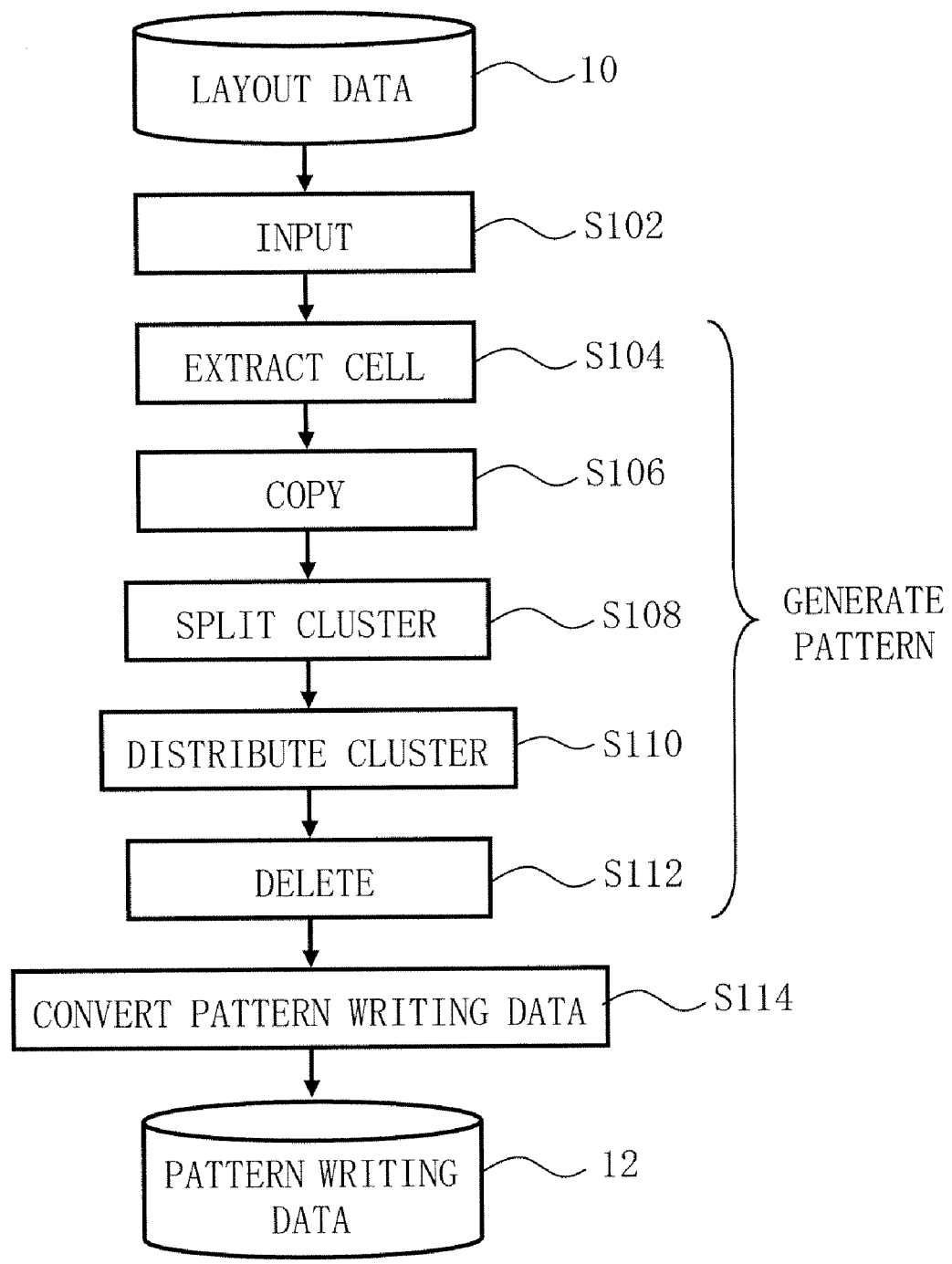
FIG. 1 is a flow chart showing main steps of a method of forming electron beam pattern writing data according to a first embodiment.

FIG. 1 is a flow chart showing main steps of a method of forming electron beam pattern writing data according to a first embodiment.

In FIG. 1, a process for verifying electron beam pattern writing data executes a series of steps including an input step (S102), a cell extracting step (S104), a copying step (S106), a cluster splitting step (S108), a cluster distributing step (S110), a deleting step (S112), and a write data converting step (S114). A pattern generating step includes steps (S106-S112).

Figure 2:
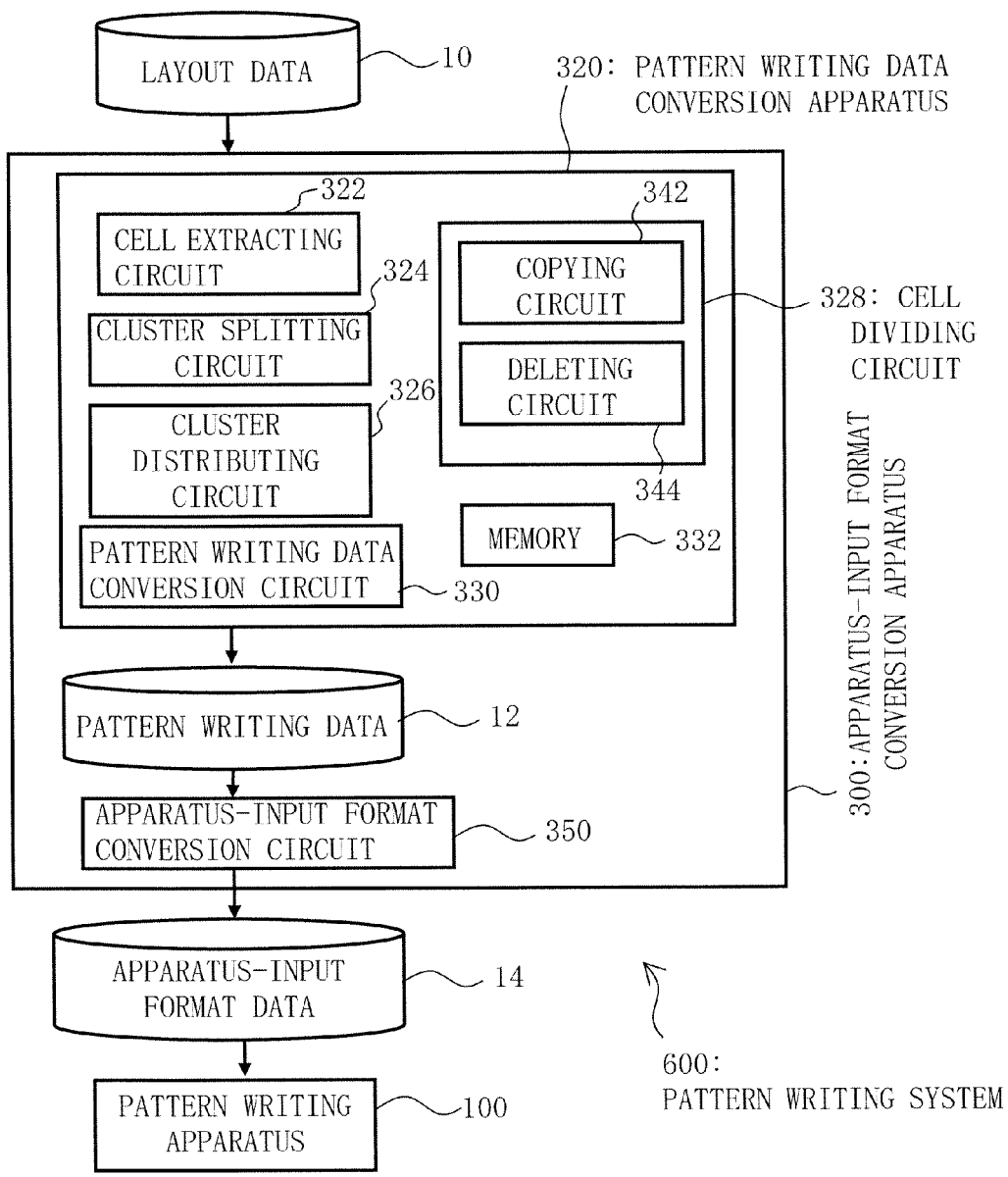
FIG. 2 is a conceptual diagram showing an example of the configuration of an apparatus-input formation conversion apparatus according to the first embodiment.

FIG. 2 is a conceptual diagram showing an example of the configuration of an apparatus-input formation conversion apparatus according to the first embodiment.

A pattern writing system 600 includes an apparatus-input format conversion apparatus 300 and a pattern writing apparatus 100. A layout of a semiconductor integrated circuit is designed to generate layout data 10 (design data). The apparatus-input format conversion apparatus 300 receives the layout data 10. The apparatus-input format conversion apparatus 300 converts the layout data 10 to generate pattern writing data 12 for use in the pattern writing apparatus 100. In the embodiment, furthermore, on the basis of the pattern writing data 12, the data is converted until shot data or the like obtained by splitting a figure in a shot size to actually shoot an electron beam is obtained. With this conversion, apparatus-input format data 14 to be input to the pattern writing apparatus 100 is generated. The apparatus-input format data 14 is output to the pattern writing apparatus 100. The pattern writing apparatus 100 writes a predetermined pattern on a target object by using an electron beam while deflecting the electron beam. The target object includes a mask for fabricating a semiconductor device.

In FIG. 2, the apparatus-input format conversion apparatus 300 includes a pattern writing data conversion apparatus 320 and an apparatus-input format conversion circuit 350. The pattern writing data conversion apparatus 320. The apparatus 320 is an example of a charged particle beam pattern writing data forming apparatus. The pattern writing data conversion apparatus 320 includes a cell extracting circuit 322, a cluster splitting circuit 324, a cluster distributing circuit 326, a cell dividing circuit 328, a pattern writing data conversion circuit 330, and a memory 332. The cell dividing circuit 328 has a copying circuit 342 and a deleting circuit 344. The pattern writing data conversion apparatus 320 forms and outputs the pattern writing data 12. The apparatus-input format conversion circuit 350 receives the pattern writing data 12 and converts the pattern writing data 12 into the apparatus-input format data 14 to output the data 14. In FIG. 2, constituent parts required to explain the first embodiment are shown. For example, the apparatus-input format conversion apparatus 300 and the pattern writing apparatus 100 may include other configurations.

Figure 3:
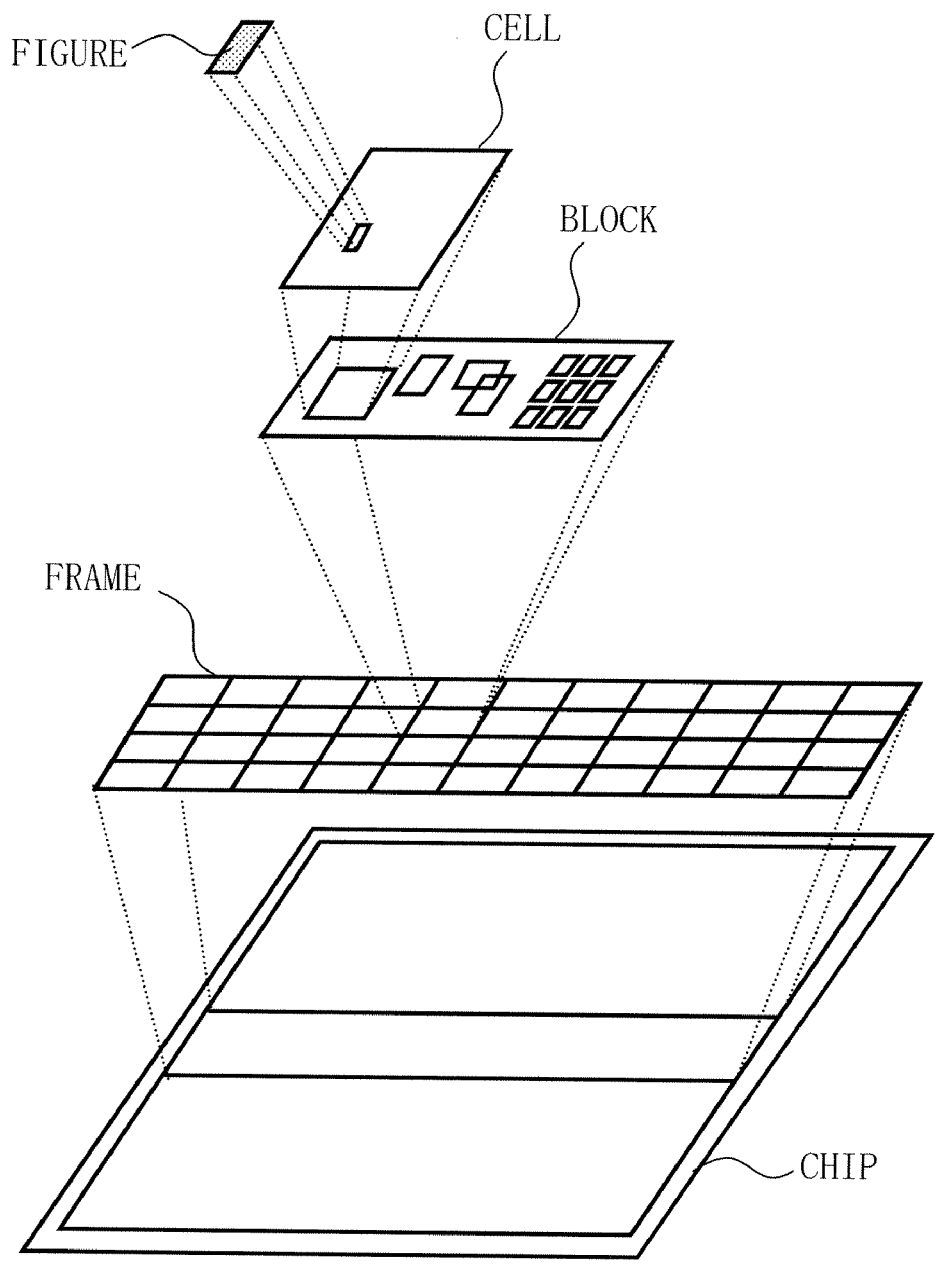
FIG. 3 is a view showing an example of a hierarchical structure of layout data according to the first embodiment.

FIG. 3 is a view showing an example of a hierarchical structure of layout data according to the first embodiment.

In the layout data 10, a pattern writing region is hierarchized in a plurality of serial internal constituent units such as a layer of chip, a layer of frame, a layer of block, a layer of cell, and a layer of figure. The frame is a region obtained by splitting a chip region in shapes of stripes along, for example, a y direction. The cell is constituted by at least one figure. The figure serves as a pattern constituting the cell.

Figure 4:
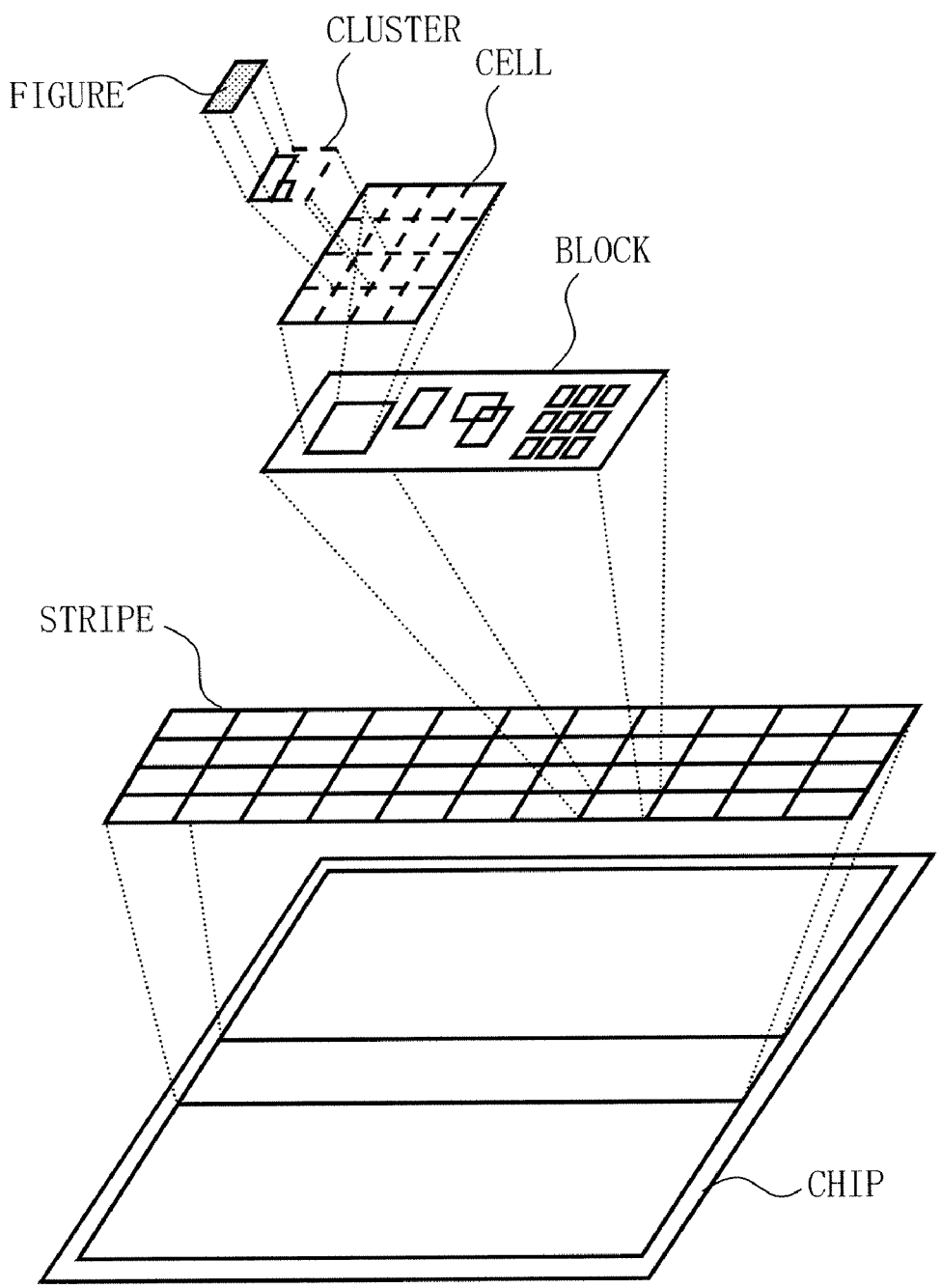
FIG. 4 is a view showing an example of a hierarchical structure of pattern writing data according to the first embodiment.

FIG. 4 is a view showing an example of a hierarchical structure of pattern writing data according to the first embodiment.

In the pattern writing data 12, a pattern writing region is hierarchized in a plurality of serial internal constituent units such as a layer of chip, a layer of frame, a layer of block, a layer of cell, a layer of cluster, and a layer of figure. The stripe is a region obtained by splitting a chip region in shapes of stripes along, for example, a y direction.

As described above, with respect to an area running out of a deflection region, deflection of a charged particle beam by a deflector does not reach the deflection region to make it impossible to perform writing.

For this reason, when a pattern (for example, cell) ranging over deflection regions is desired to be arranged, the following method is used in a conventional technique. In the conventional technique, a layout of a semiconductor integrated circuit is designed. When the layout data 10 is to be formed, the cell is divided in advance to prevent the cell from running out of the deflection region to form the layout data 10. In the embodiment, however, the following method is used when a pattern (for example, cell) ranging over a plurality of deflection regions is included in the layout. More specifically, even in such a case, the pattern is not cut by the layout data. In place of this, when the pattern writing data 12 is converted, the patterns are divided to the deflection regions, as one of the processes. A case in which the pattern is captured in a unit of cell will be explained below.

Figure 5:
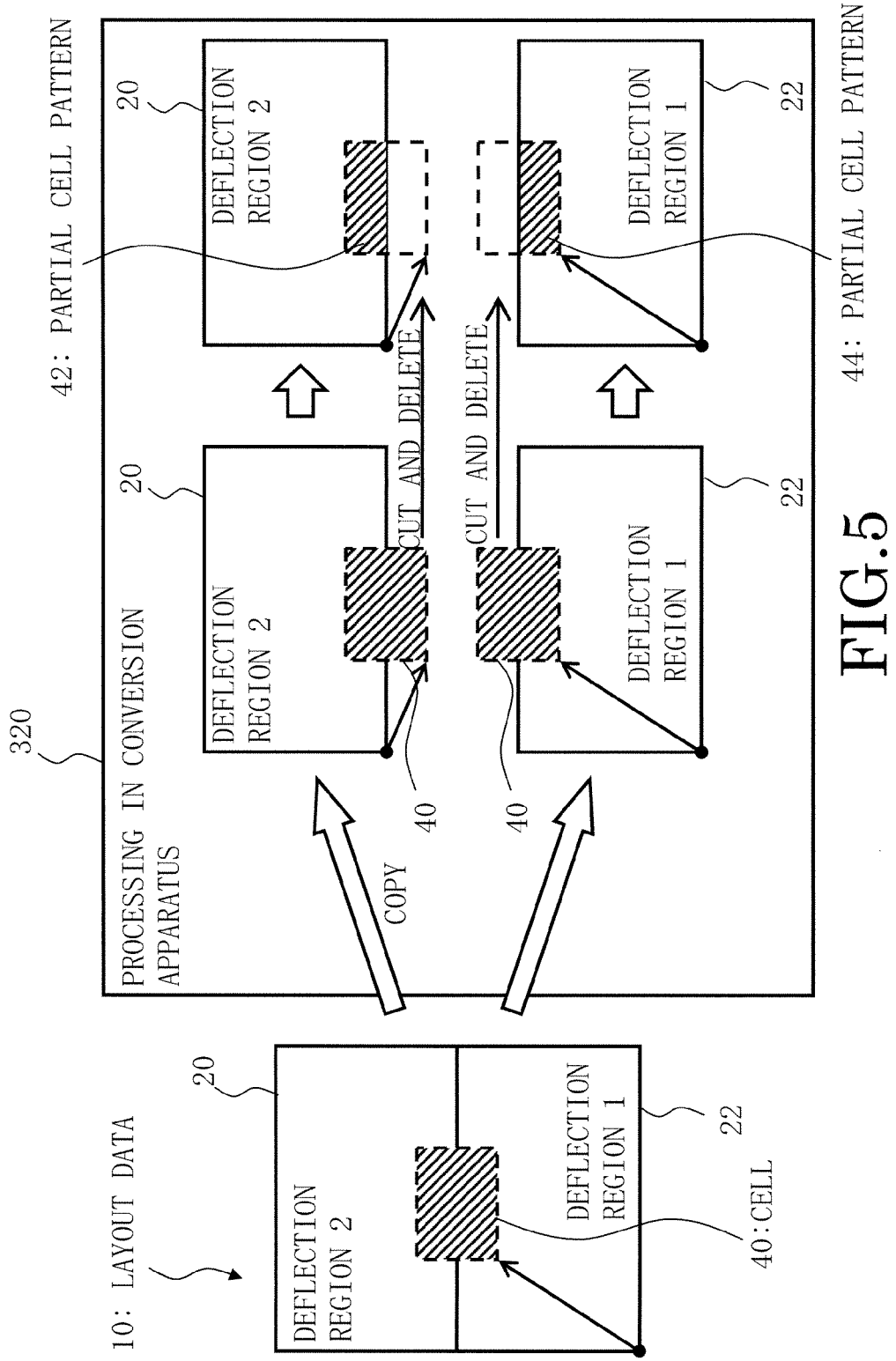
FIG. 5 is a conceptual diagram showing an example of a method of dividing a cell ranging over deflection regions according to the first embodiment.

FIG. 5 is a conceptual diagram showing an example of a method of dividing a cell ranging over deflection regions according to the first embodiment.

In FIG. 5, on the layout data 10, reference point coordinates of a cell 40 are located in a block 22 (deflection region 1). For this reason, the cell 40 is defined in the block 22. The block serves as an example of the deflection region. In other words, a ranging pattern is defined as a pattern of one deflection region of a plurality of deflection regions. The cell 40 is laid out to an adjacent block 20 (deflection region 2). As described above, the cell 40 is not split on the stage of the layout data 10. The layout data 10 is input to the pattern writing data conversion apparatus 320. On the basis of the input layout data 10, deflectable partial cell patterns 42 and 44 are generated in self regions of the cell 40 ranging the deflection regions. In FIG. 5, the data of the cell 40 is also copied (duplicated) on the block 20. The cell 40 is defined on the block 20. In the block 22, a part of the cell 40 except for the deflectable partial cell pattern 44 in the self region is cut and deleted. Similarly, in the block 20, a part of the cell 40 except for the deflectable partial cell pattern 42 in the self region is cut and deleted. In this manner, the data of the ranging pattern is coped on ranging deflection regions to delete a pattern portion which cannot be deflected in the self region. In this manner, the cell ranging in the pattern writing data conversion apparatus 320 can be divided to the respective deflection regions. As a result, the pattern need not be split by the layout data 10. With the above configuration, not in formation of the layout data 10, in formation of the pattern writing data 12, partial patterns of respective regions can be generated when there is a pattern ranging over a plurality of deflection regions. This will be described in detail.

In step S102 in FIG. 1, the pattern writing data conversion apparatus 320, as an input step, receives the layout data 10. The layout data 10 includes a cell ranging over a plurality of deflection regions.

In S104 in FIG. 1, the cell extracting circuit 322, as a cell extracting step, extracts a cell defined in a self region for each block from the layout data 10.

Figure 6:
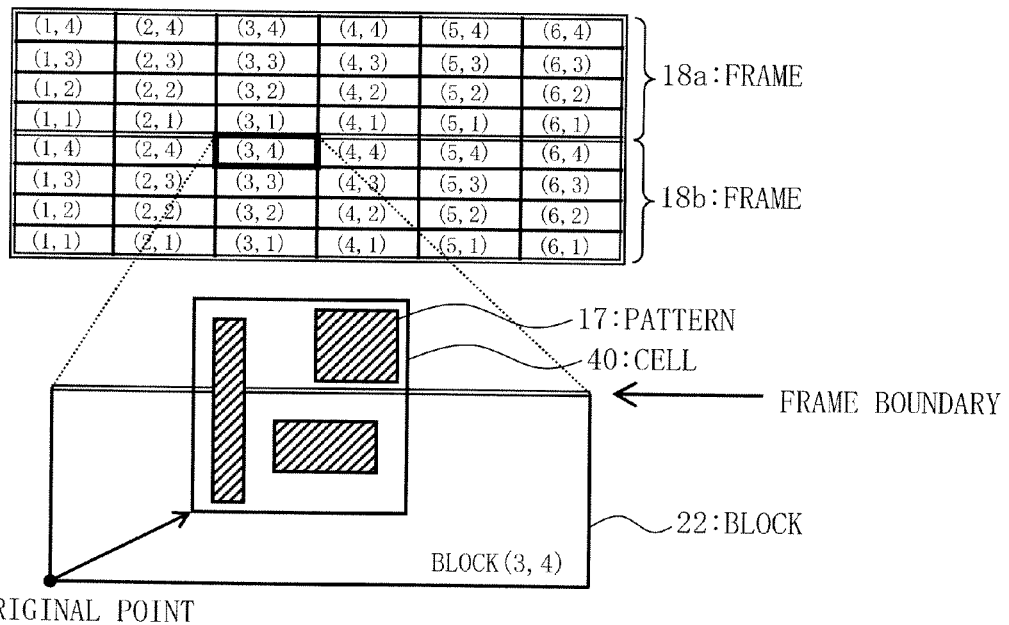
FIG. 6 is a diagram showing an example of a cell ranging over a plurality of deflection regions according to the first embodiment.

FIG. 6 is a diagram showing an example of a cell ranging over a plurality of deflection regions according to the first embodiment.

A pattern writing region in which writing is performed on the basis of the layout data 10 and the pattern writing data 12 is divided into frames 18 serving as a plurality of stripe-shaped regions each having a width W at which deflection can be performed by a deflector. A pattern is written in a region of the adjacent frames 18 by the pattern writing apparatus 100 as follows. More specifically, since the region which exceeds a region which can be changed by the deflector of the pattern writing apparatus 100, the stage of the pattern writing apparatus 100 is moved. The movement of the stage causes the stage to be consequently moved to a region which can be changed by the deflector. As shown in FIG. 6, each of the frames 18 is further divided into a plurality of blocks. FIG. 6 shows a case of extracting a cell defined in a self region in the block 22 located at block coordinates (3, 4). Furthermore, FIG. 6 shows a case in which, at the block coordinates (3, 4), the cell 40 is laid out to range over the regions of a frame 18*a* and a frame 18*b* which require to move the stage of the pattern writing apparatus 100. Specifically, the cell 40 is defined in the block 22 being in contact with a boundary of the frame 18*b*. The cell 40 ranges to the block 20 being in contact with a boundary of the adjacent frame 18*a*. The cell 40 is constituted by a pattern 17.

In S106 in FIG. 1, as a copying step serving as a part of a pattern forming step, the copying circuit 342 in the cell dividing circuit 328 copies (duplicates) the data of the cell 40 to the block 20 serving as ranging deflection regions.

Figure 7:
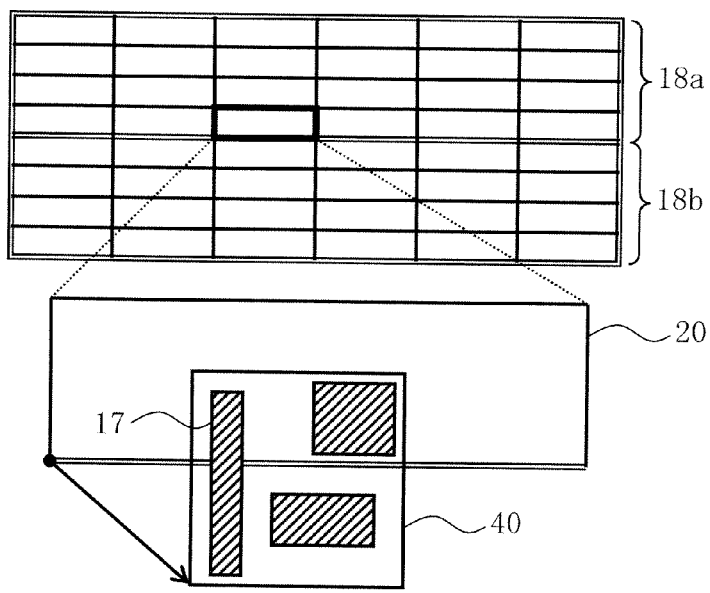
FIG. 7 is a diagram showing an example of a cell copied on deflection regions over which the cell ranges according to the first embodiment.

FIG. 7 is a diagram showing an example of a cell copied on deflection regions over which the cell ranges according to the first embodiment. As shown in FIG. 7, the cell 40 defined in the block 22 is also copied to the ranging block 20. The cell 40 is defined as a cell in the block 20. The cell 40 is copied to make it possible to cause an undefined region to recognize the pattern located in the self region.

In S108 in FIG. 1, the cluster splitting circuit 324, as a cluster splitting step, splits the cell 40 into clusters.

Figure 8:
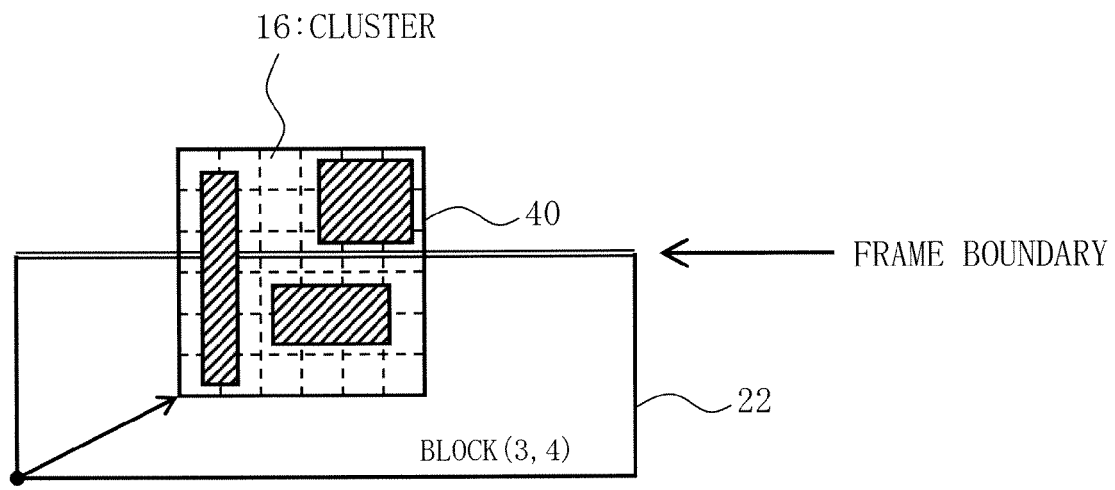
FIG. 8 is a diagram showing an example obtained by splitting a cell according to the first embodiment into clusters.

FIG. 8 is a diagram showing an example obtained by splitting a cell into clusters according to the first embodiment.

FIG. 8 shows the cell 40 defined in the block 22. As shown in FIG. 8, the region of the cell 40 defined in the block 22 is split into clusters, i.e., regions of a plurality of clusters 16. The region which is split into clusters can be used at an exposure position when multiple exposure is performed in the pattern writing apparatus 100.

Figure 9:
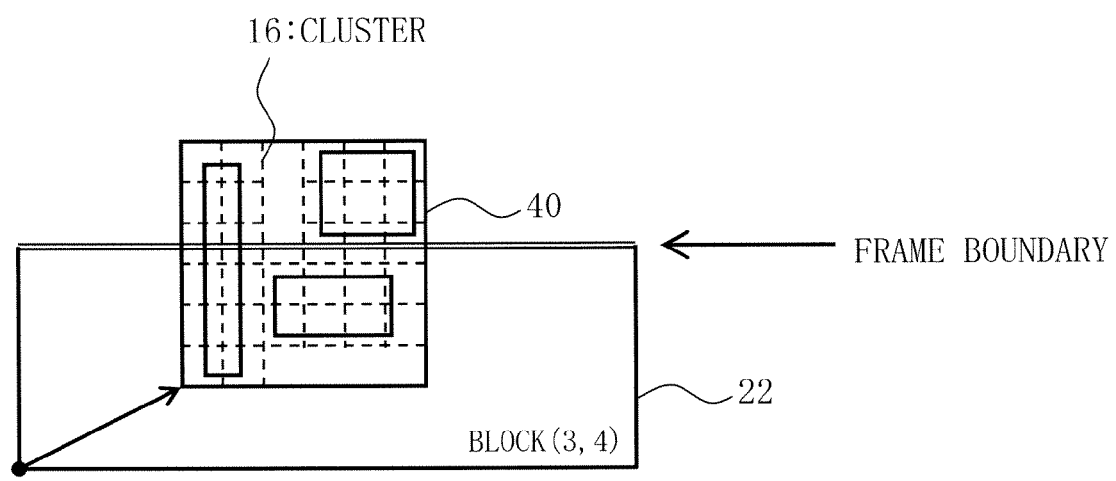
FIG. 9 is a diagram showing an example obtained by splitting the cell in FIG. 8 into cluster margins.

FIG. 9 is a diagram showing an example obtained by splitting the cell in FIG. 8 into cluster margins.

As shown in FIG. 9, after the region is split into clusters, a process of omitting a cluster 16 including no pattern 17 is performed to make it possible to reduce an amount of data.

Figure 10:
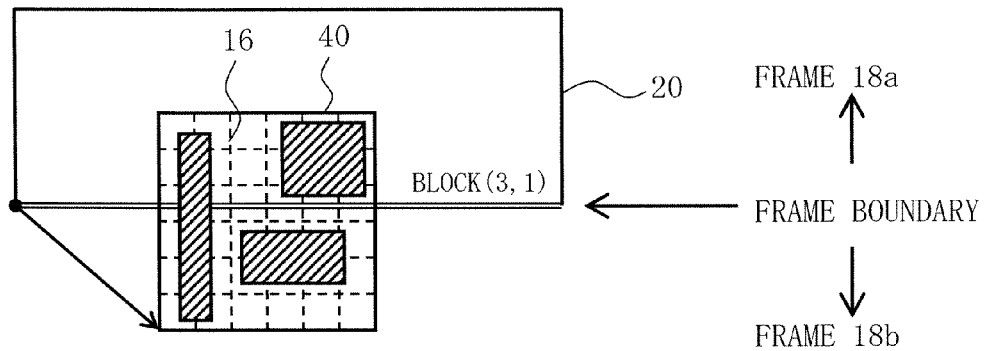
FIG. 10 is a diagram showing an example obtained by splitting the copied cell into clusters according to the first embodiment.

FIG. 10 is a diagram showing an example obtained by splitting the copied cell into clusters according to the first embodiment.

FIG. 10 shows the cell 40 coped and defined in the block 20. As shown in FIG. 10, as in the block 22, the region of the cell 40 defined in the block 20 is split into clusters, i.e., the regions of the plurality of clusters 16. The region which is split into clusters can be used at an exposure position when multiple exposure is performed in the pattern writing apparatus 100.

Figure 11:
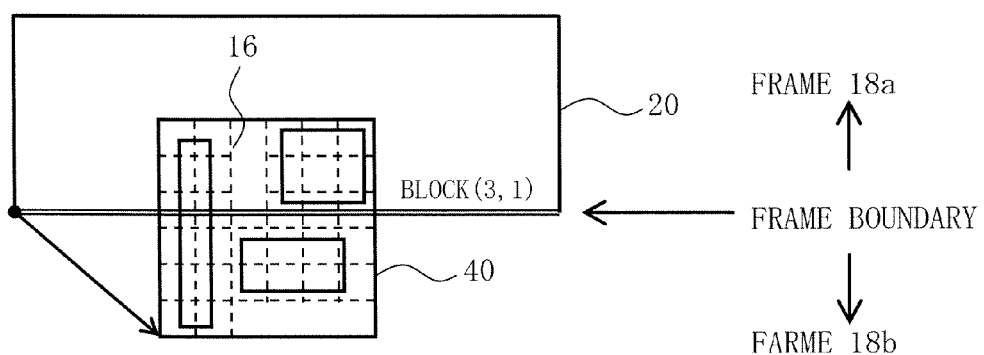
FIG. 11 is a diagram showing an example obtained by splitting the cell in FIG. 10 into cluster margins.

FIG. 11 is a diagram showing an example obtained by splitting the cell in FIG. 10 into cluster margins.

As shown in FIG. 11, as in the block 22, a process of omitting a cluster 16 including no pattern 17 is performed after the region is split into clusters, thereby making it possible to reduce an amount of data.

In S110 in FIG. 1, as a cluster distributing step, the cluster distributing circuit 326 cuts a pattern portion which cannot be deflected by the self region in the ranging cell 40 in the deflection region in which the ranging cell 40 is defined and another deflection region to which the cell 40 ranges to separate the cell 40 into a plurality of partial cell patterns.

Figure 12:
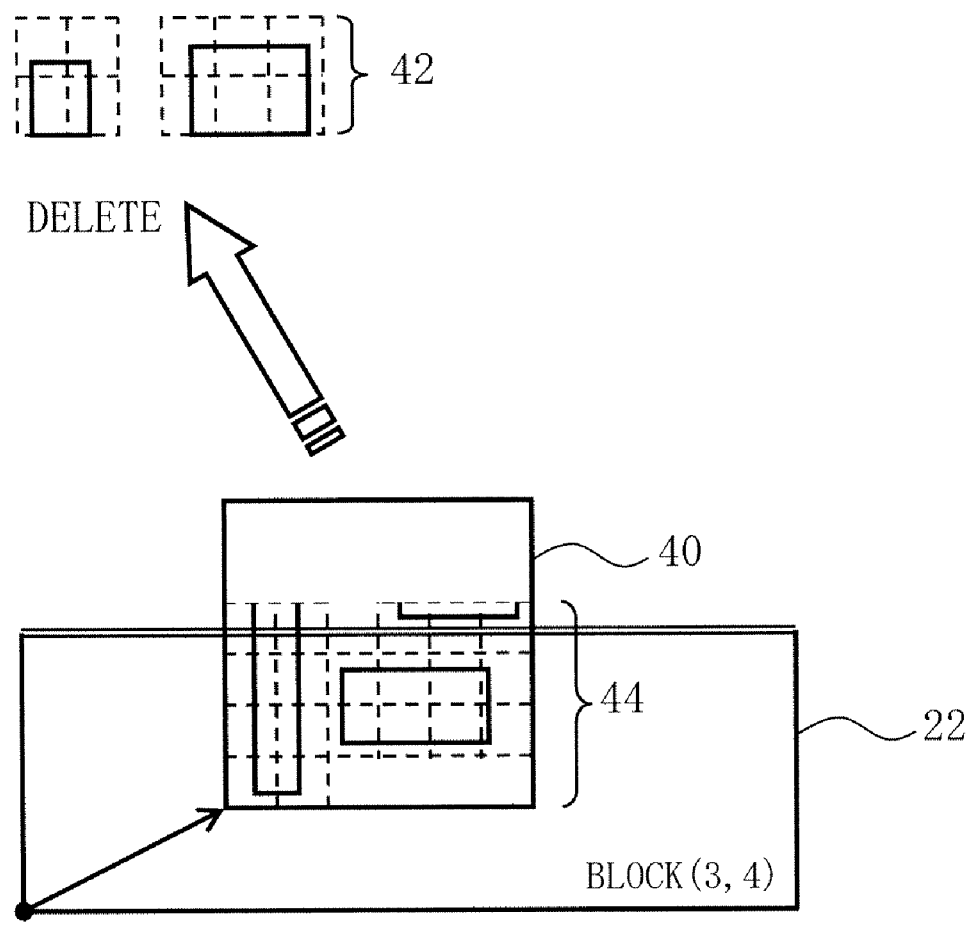
FIG. 12 is a diagram showing an example obtained by cutting a cell according to the first embodiment.

FIG. 12 is a diagram showing an example obtained by cutting a cell according to the first embodiment.

As shown in FIG. 12, with respect to the cell 40 defined in the block 22, a partial cell pattern 44 serving as a pattern portion which can be deflected in the self region and a partial cell pattern 42 serving as a pattern portion which cannot be deflected are generated. The partial cell pattern 42 running out of the deflection region is cut.

Figure 13:
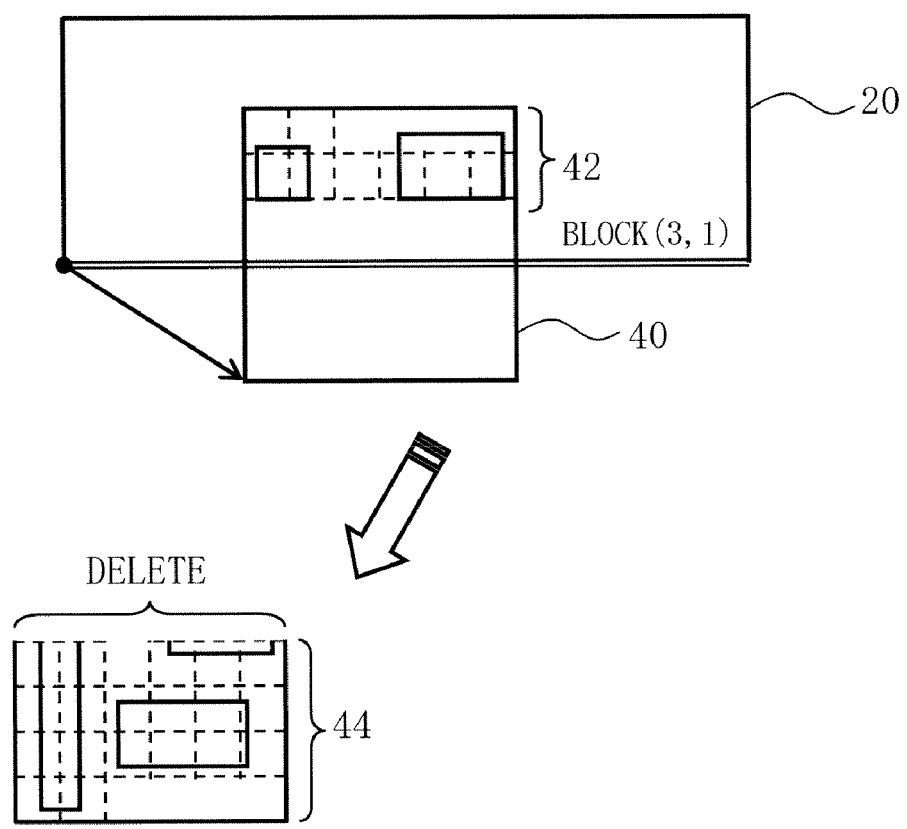
FIG. 13 is a diagram showing an example obtained by cutting the copied cell according to the first embodiment.

FIG. 13 is a diagram showing an example obtained by cutting the copied cell according to the first embodiment.

As shown in FIG. 13, with respect to the cell 40 defined in the block 22, a partial cell pattern 42 serving as a pattern portion which can be deflected in the self region and a partial cell pattern 44 serving as a pattern portion which cannot be deflected are generated. The partial cell pattern 44 running out of the deflection region is cut.

In S112 in FIG. 1, the deleting circuit 344 in the cell dividing circuit 328, as a deleting step, deletes a pattern portion which runs out of the self deflection region and cannot be deflected in the ranging cell 40 in the deflection region in which the ranging cell 40 is defined and another deflection region to which the cell 40 ranges. More specifically, as shown in FIG. 12, with respect to the cell 40 defined in the block 22, data of the cut and separated partial cell pattern 42 serving as the pattern portion which cannot be deflected in the self region is deleted. Similarly, as shown in FIG. 13, with respect to the cell 40 defined in the block 20, the cut and separated partial cell pattern 44 serving as the pattern portion which cannot be deflected in the self region is deleted.

With the above configuration, it is possible to generate, on the basis of the input layout data 10, the partial pattern which can be deflected in the self region among the patterns ranging to each deflection region of the plurality of deflection patterns. As a result, a cell ranging in the pattern writing data conversion apparatus 320 can be divided to the respective deflection regions without being split by the layout data 10. Therefore, the amount of the layout data 10 can be reduced.

In S114 in FIG. 1, the pattern writing data conversion circuit 330, as a pattern writing data conversion step, converts the layout data 10 into the pattern writing data 12 in units of blocks or frames 18. The pattern writing data 12 is output from the pattern writing data conversion apparatus 320 to the apparatus-input format conversion circuit 350.

In the above explanation, input/output data of the circuits are stored in the memory 332 and transmitted to other circuits through the memory 332. The data transmission is not limited to the above explanation, and data communication may be directly performed between the circuits. The data communication may be performed through a bus (not shown).

Figure 14:
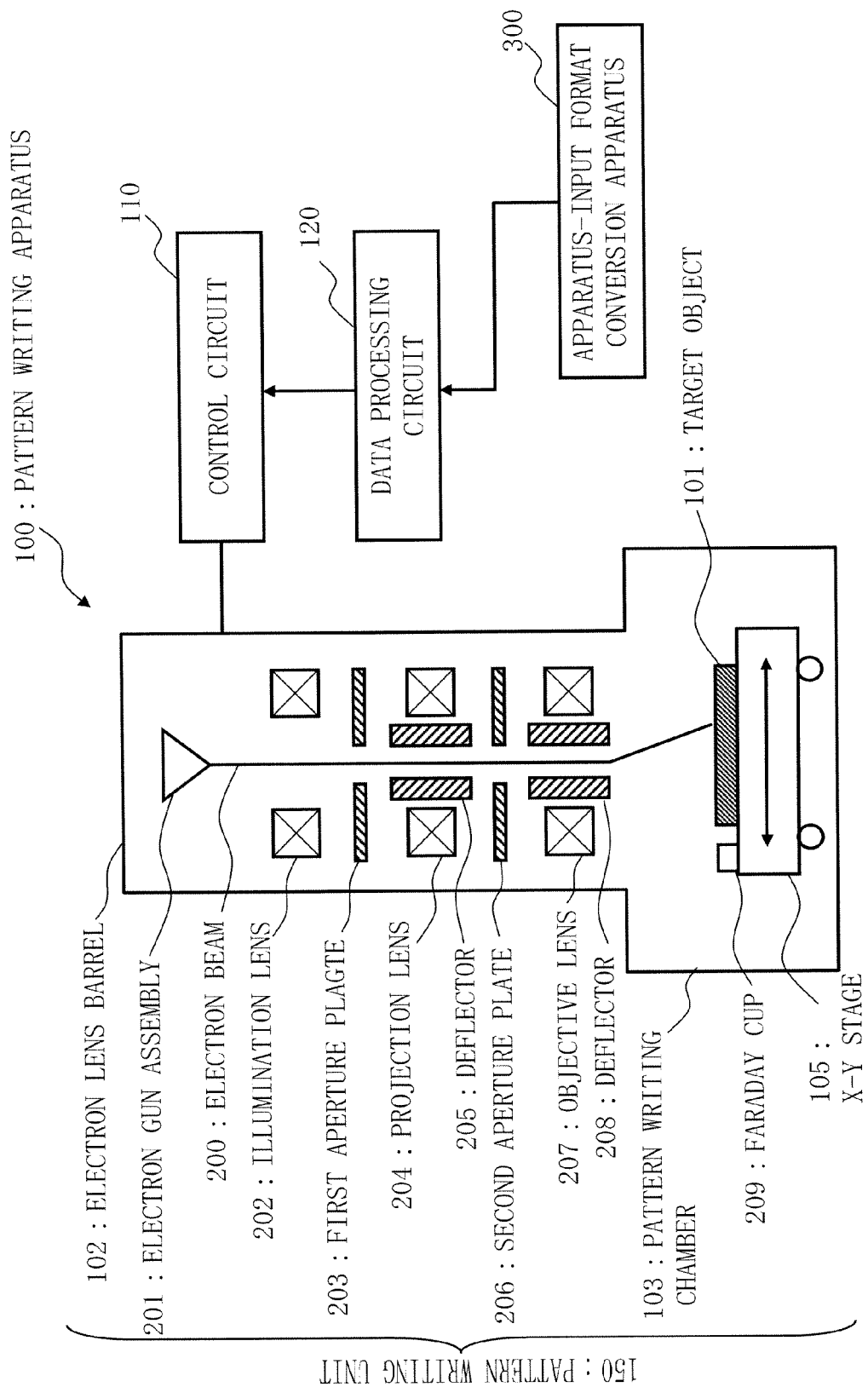
FIG. 14 is a conceptual diagram showing an example of a main configuration of a pattern writing system according to the first embodiment.

FIG. 14 is a conceptual diagram showing an example of a main configuration of a pattern writing system according to the first embodiment.

In FIG. 14, the pattern writing system 600 includes an exposure apparatus serving as an example of the pattern writing apparatus 100 and the apparatus-input format conversion apparatus 300. The pattern writing apparatus 100 includes a pattern writing unit 150, a control circuit 110, and a data processing circuit 120. The pattern writing unit 150 has an electron lens barrel 102 and a pattern writing chamber 103. An electron gun assembly 201, an illumination lens 202, a first aperture plate 203, a projection lens 204, a deflector 205, a second aperture plate 206, an objective lens 207, and a deflector 208 are arranged in the electron lens barrel 102. An X-Y stage 105 is arranged in the pattern writing chamber 103. The X-Y stage 105 has a Faraday cup 209 arranged thereon. A target object 101 is arranged on the X-Y stage 105. In FIG. 14, constituent parts required to explain the first embodiment are shown. The pattern writing apparatus 100 may include other configurations.

The apparatus-input format conversion apparatus 300 generates the apparatus-input format data 14, and then outputs the data 14 to the data processing circuit 120. The data processing circuit 120 performs data processing to drive the respective circuits on the basis of the input apparatus-input format data 14. Then, respective control signals are transmitted from the data processing circuit 120 to the control circuit 110. The pattern writing unit 150 is controlled by the control circuit 110 to write a figure pattern included in the pattern writing data 12 on the target object 101.

An electron beam 200 emitted from the electron gun assembly 201 illuminates the entire area of the first aperture plate 203 having, for example, a rectangular hole through the illumination lens 202. In this case, the electron beam 200 is shaped into, e.g., a rectangle. The electron beam 200 of a first aperture image having passed through the first aperture plate 203 is projected on the second aperture plate 206 by the projection lens 204. A position of the first aperture image on the second aperture plate 206 is controlled by the deflector 205. In this manner, a beam shape and a beam size can be changed. The electron beam 200 of a second aperture image having passed through the second aperture plate 206 is focused by the objective lens 207. The electron beam 200 is deflected by the deflector 208 and irradiated on a desired position of the target object 101 on the X-Y stage 105. During the writing, the X-Y stage 105 continuously moves. As described above, a pattern writing region is deflected within a region (stripe in the pattern writing data 12) split into stripe regions each having a width at which deflection can be performed by the deflector 208. The X-Y stage 105 is moved to an adjacent region which cannot be deflected to make it possible to move the target object 101 to a position where deflection can be performed by the deflector 208.

Figure 15:
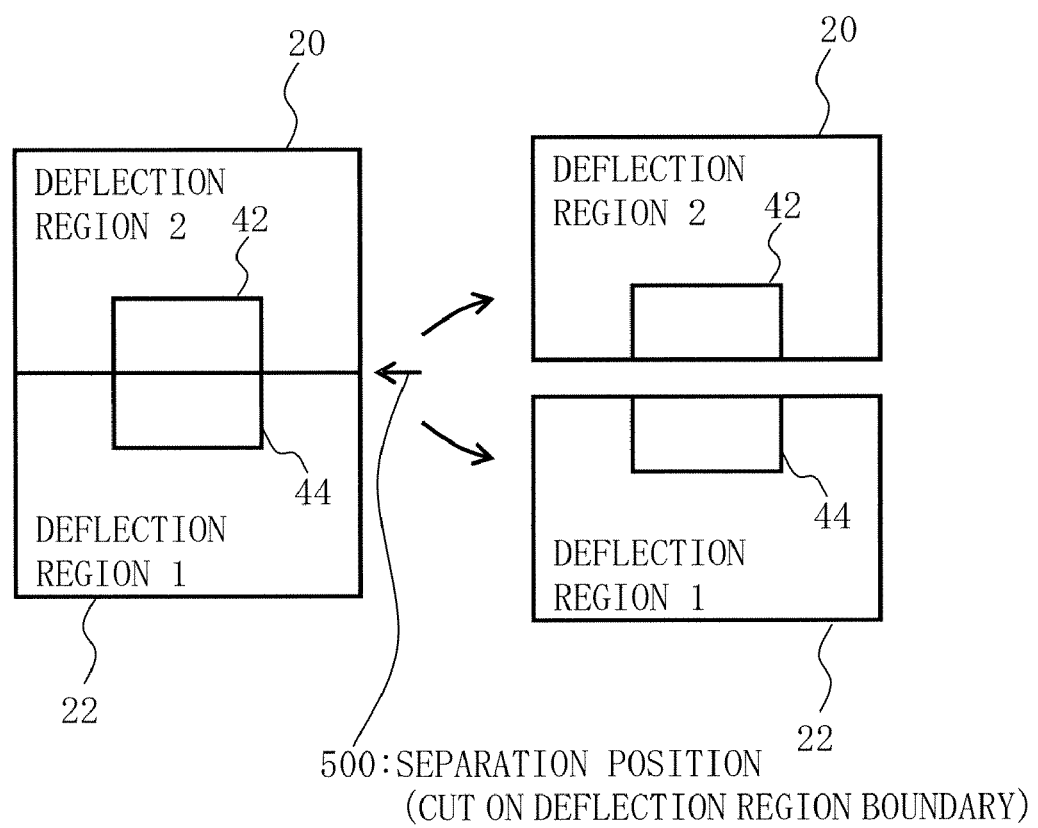
FIG. 15 is a diagram showing an example of a cutting position according to the first embodiment.

FIG. 15 is a diagram showing an example of a cutting position according to the first embodiment.

When the block 20 ranges to the cell 40 defined in the block 22, the cutting operation can be performed such that a position on a deflection region boundary is set as a separation position 500 (cutting position). The partial cell pattern 44 is defined in the block 22, and the partial cell pattern 42 is defined in the block 20.

The cutting position is not limited to the position described above, and another position may be used.

Figure 16:
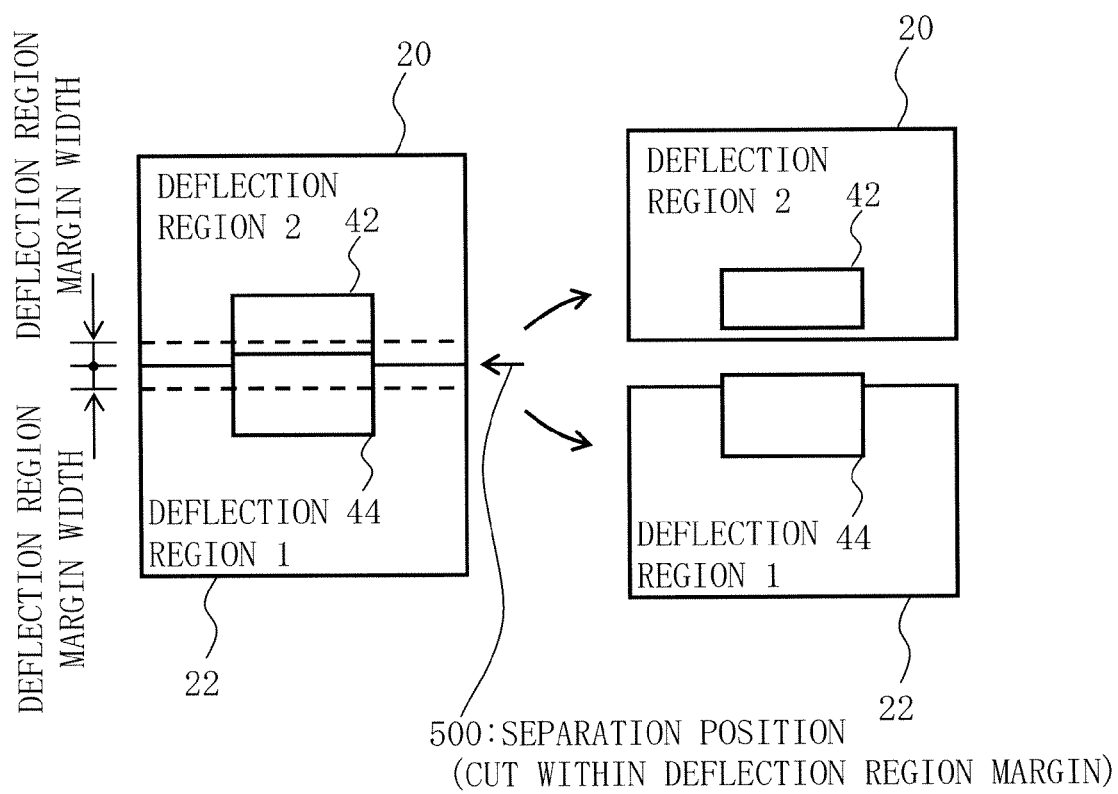
FIG. 16 is a diagram showing an example of another cutting position according to the first embodiment.

FIG. 16 is a diagram showing an example of another cutting position according to the first embodiment.

The deflection region boundary is set inside an actually deflectable boundary with a some margin width. Therefore, when the block 20 ranges to the cell 40 defined in the block 22, a cutting operation is preferably performed such that any position in the deflection region margin is used as the separation position 500 (cutting position). The partial cell pattern 44 is defined in the block 22, and the partial cell pattern 42 is defined in the block 20. Alternatively, the cutting operation may be performed as follows.

Figure 17:
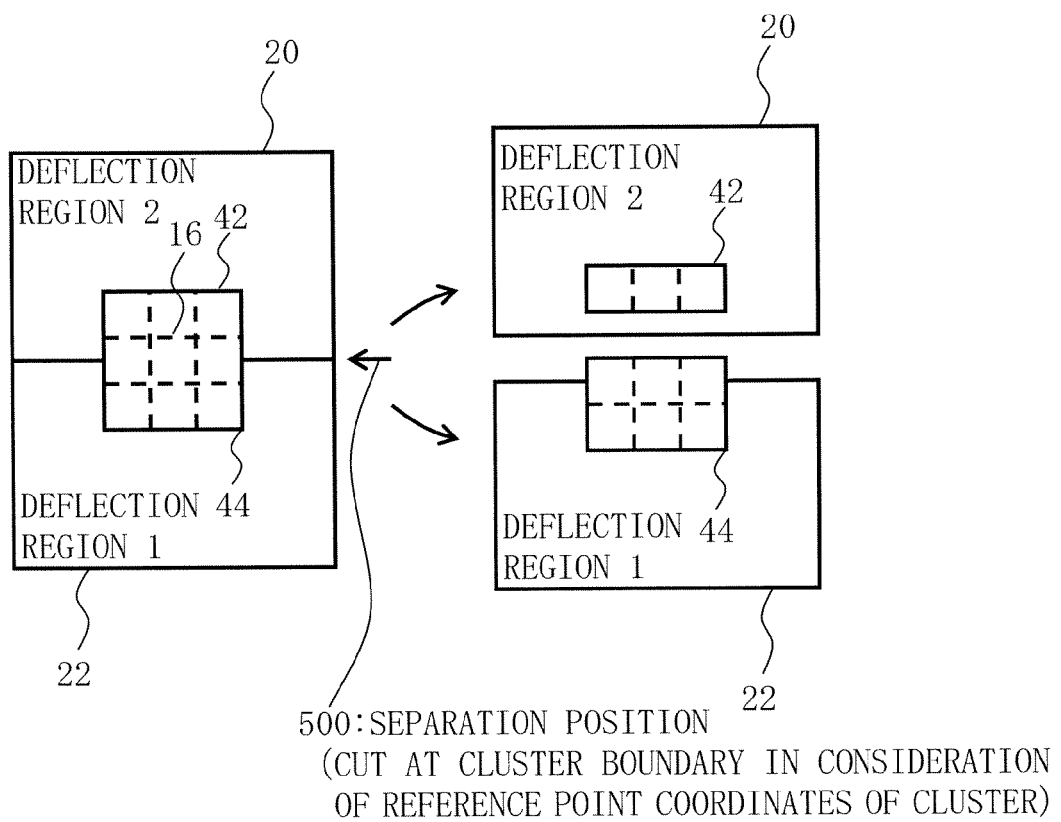
FIG. 17 is a diagram showing an example of still another cutting position according to the first embodiment.

FIG. 17 is a diagram showing an example of still another cutting position according to the first embodiment.

The clusters 16 generated by cluster splitting are also defined in a cell in which the reference point coordinates are located. Therefore, when the block 20 ranges over the cell 40 defined in the block 22, the block 20 is preferably cut such that a position on a cluster boundary is set as the separation position 500 (cutting position) in the deflection region margin. When the cluster 16 ranges over the deflection region boundary, the block 20 is more preferably cut at the cluster boundary in consideration of the reference point coordinates of the cluster 16 such that the cluster 16 is on the partial pattern side on which the cluster 16 is defined. The partial cell pattern 44 is defined in the block 22, and the partial cell pattern 42 is defined in the block 20. Alternatively, the cutting operation may be performed as follows.

Figure 18:
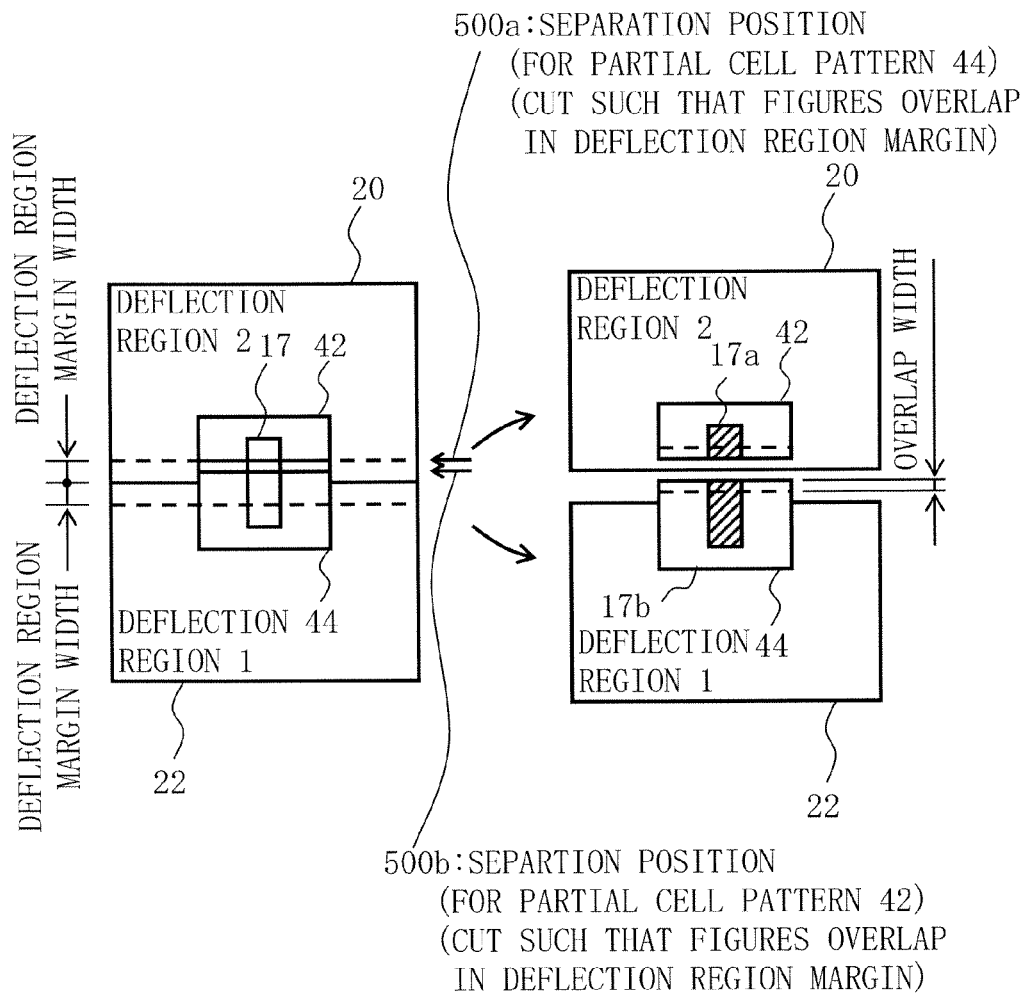
FIG. 18 is a diagram showing an example of still another cutting position according to the first embodiment.

FIG. 18 is a diagram showing an example of still another cutting position according to the first embodiment.

In FIG. 18, when the block 20 ranges to the cell 40 defined in the block 22, a cutting operation is also preferably performed at two separation positions 500 (separation position 500*a* and separation position 500*b*) in a deflection region margin such that the pattern 17 constituting the cell 40 partially overlaps. The partial cell pattern 44 including a pattern 17*b* is defined in the block 22, and the partial cell pattern 42 including a pattern 17*a* is defined in the block 20. Alternatively, the cutting operation may be performed as follows.

Figure 19:
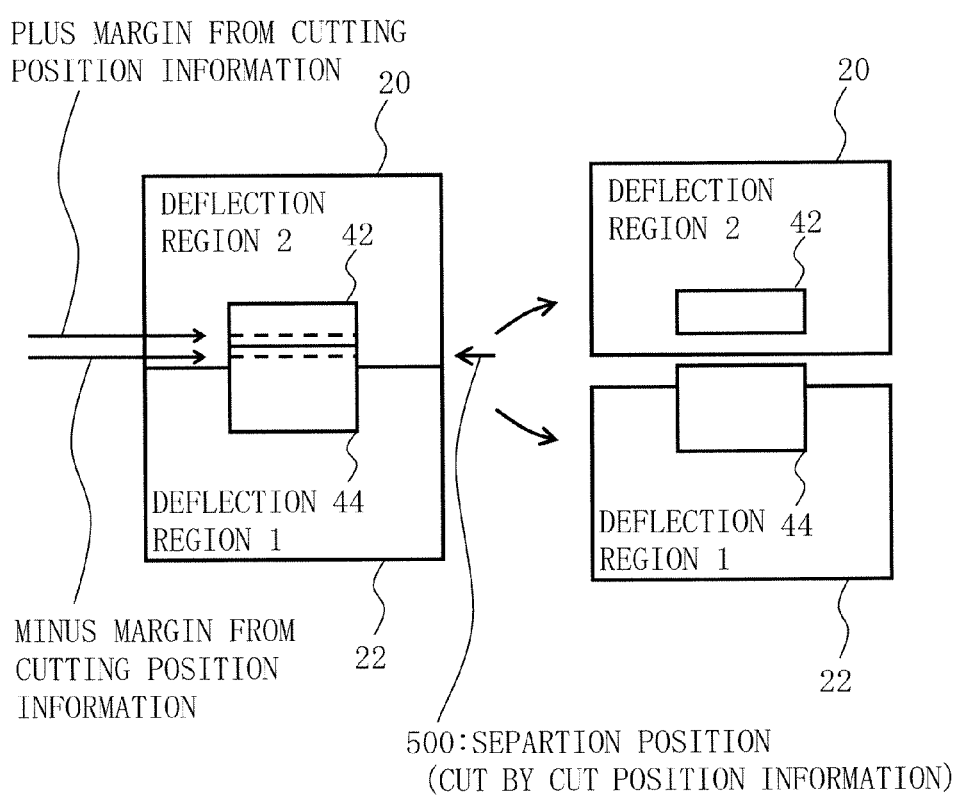
FIG. 19 is a diagram showing an example of still another cutting position according to the first embodiment.

FIG. 19 is a diagram showing an example of still another cutting position according to the first embodiment.

Although the layout data 10 includes cell pattern data, a cutting position is preferably defined for the cell as attribute information with respect to a cell ranging over a plurality of deflection regions. For example, as shown in FIG. 19, cutting position information having a plus margin and a minus margin is prepared as attribute information. A cutting operation is preferably performed such that a position obtained by the cutting position information is set as the separation position 500. The partial cell pattern 44 is defined in the block 22, and the partial cell pattern 42 is defined in the block 20.

In this case, cell patterns included in the layout data 10 are not limited to cell patterns defined in blocks in which self reference position coordinates are independently located. With respect to cell patterns which are repeatedly arranged, one cell pattern and repeat information may be defined as an array cell in one block.

Figure 20:
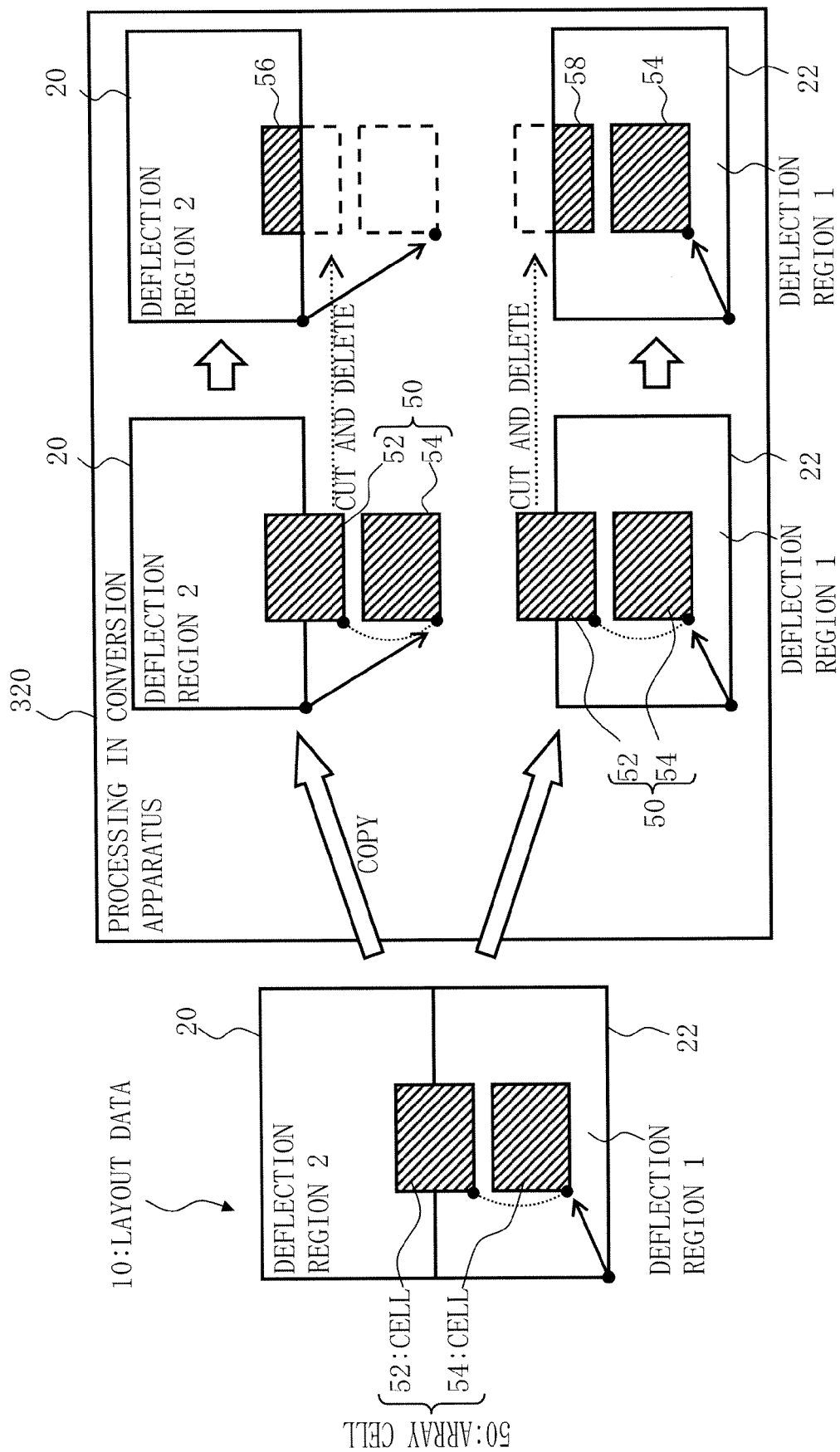
FIG. 20 is a conceptual diagram showing an example of a method of dividing a cell having an array structure ranging over deflection regions according to the first embodiment.

FIG. 20 is a conceptual diagram showing an example of a method of dividing a cell having an array structure ranging over deflection regions according to the first embodiment.

In FIG. 20, on the layout data 10, reference point coordinates of an array cell 50 constituted by a cell 52 and a cell 54 are located in the block 22 (deflection region 1) serving as an example of the deflection region. For this reason, the array cell 50 is defined in the block 22. Of the array cell 50, the cell 52 is laid out over the adjacent block 22 (deflection region 2). As described above, on the stage of the layout data 10, the array cell 50 is input to the pattern writing data conversion apparatus 320 without being split. On the basis of the input layout data 10, partial cell patterns 56 and 58 which can be deflected in a self region of the cell 52 constituting the array cell 50 ranging over the deflection regions are generated. In FIG. 20, data of the array cell 50 is also copied (duplicated) to the block 20. The array cell 50 is defined in the block 20. In the block 22, a portion of the array cell 50 except for the partial cell pattern 58 which can be deflected in the self region in the ranging cell 52 is cut and deleted. Similarly, in the block 20, a portion of the array cell 50 except for the partial cell pattern 56 which can be deflected in the self region is cut and deleted. As described above, the data of the ranging pattern is copied to the ranging deflection region while keeping the array structure, and a pattern portion which cannot be deflected in the self region is deleted. In this manner, a cell ranging in the pattern writing data conversion apparatus 320 can be divided to respective deflection regions. Accordingly, the layout data 10 can be formed while keeping the array structure without unnecessarily splitting the cell by the layout data 10. As a result, in addition to an increase in amount of data to divide the cell to the partial cell patterns of the layout data 10, an increase in amount of data caused by decomposing the array structure can be avoided. Since the respective steps are the same as those in FIG. 1, explanation thereof is omitted.

Figure 21:
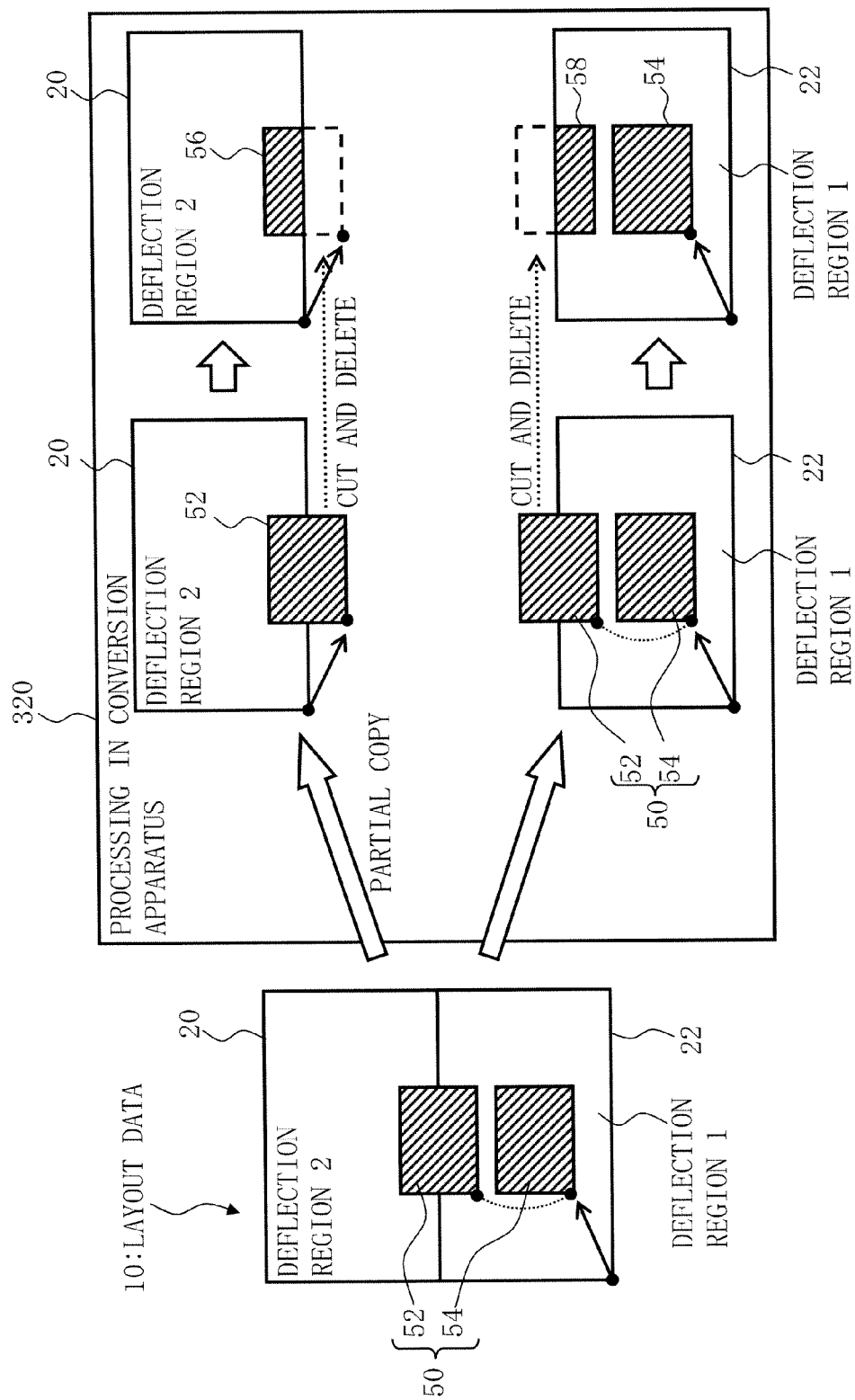
FIG. 21 is a conceptual diagram showing another example of the method of dividing a cell having an array structure ranging over deflection regions according to the first embodiment.

FIG. 21 is a conceptual diagram showing another example of the method of dividing a cell having an array structure ranging over deflection regions according to the first embodiment.

In FIG. 21, on the layout data 10, reference point coordinates of the array cell 50 constituted by the cell 52 and the cell 54 are located in the block 22 (deflection region 1) serving as an example of the deflection region. For this reason, the array cell 50 is defined in the block 22. Of the array cell 50, the cell 52 is laid out over the adjacent block 20 (deflection region 2). On the stage of the layout data 10, the array cell 50 is input to the pattern writing data conversion apparatus 320 without being split. The operations up to now are the same as those in FIG. 20. On the basis of the input layout data 10, partial cell patterns 56 and 58 are generated which can be deflected in a self region of the cell 52 constituting the array cell 50 ranging over the deflection regions. However, in FIG. 21, entire data of the array cell 50 is copied (duplicated) to the block 20, and only data of the cell 52 ranging to the block 20 is copied to the block 20. The array cell 52 is defined in the block 20. In the block 22, a portion of the array cell 50 except for the partial cell pattern 58 which can be deflected in the self region in the ranging cell 52 is cut and deleted. Similarly, in the block 20, a portion of the array cell 52 except for the partial cell pattern 56 which can be deflected in the self region is cut and deleted. As described above, the data of the ranging pattern is copied to the ranging deflection region while keeping the array structure, and a pattern portion which cannot be deflected in the self region is deleted. In this manner, a cell ranging in the pattern writing data conversion apparatus 320 can be divided to respective deflection regions. Accordingly, the layout data 10 can be formed while keeping the array structure without unnecessarily splitting the cell by the layout data 10. As a result, in addition to an increase in amount of data to divide the cell to the partial cell patterns of the layout data 10, an increase in amount of data caused by decomposing the array structure can be avoided. Since the respective steps are the same as those in FIG. 1, explanation thereof is omitted.

As described above, of a plurality of deflection regions, a deflection region to which data of a ranging pattern (cell) ranges is copied. Thereafter, a pattern portion which cannot be deflected in the self region is deleted to make it possible to divide the cell ranging in the pattern writing data conversion apparatus 320 to respective deflection regions. Consequently, the cell need not be split on the stage of the layout data 10. This allows an amount of the layout data 10 to be reduced. As a result, time required for transferring the data to the pattern writing data conversion apparatus 320 can be shortened.

The case in which the cell is divided on the stage of the layout data 10 is compared with the case in which the cell is divided when the data is converted into the pattern writing data 12. In this case, times required to transmit the pattern writing data 12 from the pattern writing data conversion apparatus 320 to the apparatus-input format conversion circuit 350 are equal to each other. However, times required to input (transfer) the layout data 10 to the pattern writing data conversion apparatus 320 are considerably different from each other. More specifically, when the cell is divided on the stage of the layout data 10 to increase an amount of the layout data 10, time required for transferring data to the pattern writing data conversion apparatus 320 is considerably elongated. In the embodiment, the ranging pattern is divided when the data is converted into the pattern writing data 12. Thus, it becomes possible to shorten time from when input of the layout data 10 to the pattern writing data conversion apparatus 320 is started to when the layout data 10 is transmitted to the apparatus-input format conversion circuit 350.

Second Embodiment

In a second embodiment, explanation will be given with respect to a method of dividing a pattern (for example, cell) ranging a plurality of deflection regions on a layout to respective deflection regions by a method different from that in the first embodiment. As in the first embodiment, a case in which a pattern is captured in units of cells will be described below. As a position where a ranging pattern is cut and separated, positions in various configurations can be applied as in the first embodiment.

Figure 22:
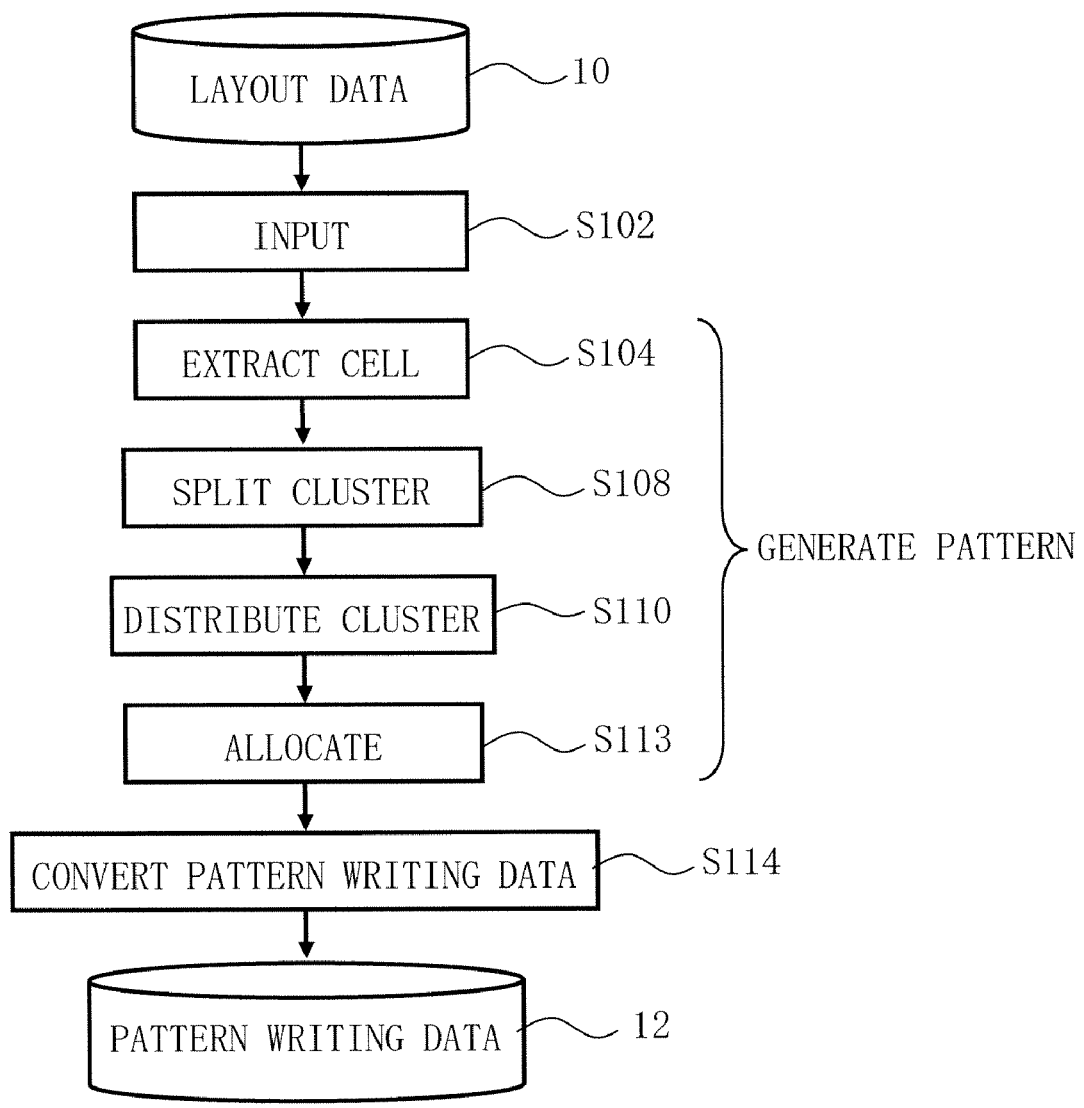
FIG. 22 is a flow chart showing main steps of a method of forming electron beam pattern writing data according to a second embodiment.

FIG. 22 is a flow chart showing main steps of a method of forming electron beam pattern writing data according to the second embodiment.

In FIG. 22, a process for verifying electron beam pattern writing data performs a series of steps including an input step (S102), a cell extracting step (S104), a cluster splitting step (S108), a cluster distributing step (S110), an allocating step (S113) serving as a part of the pattern generating step, and a pattern writing data converting step (S114).

Figure 23:
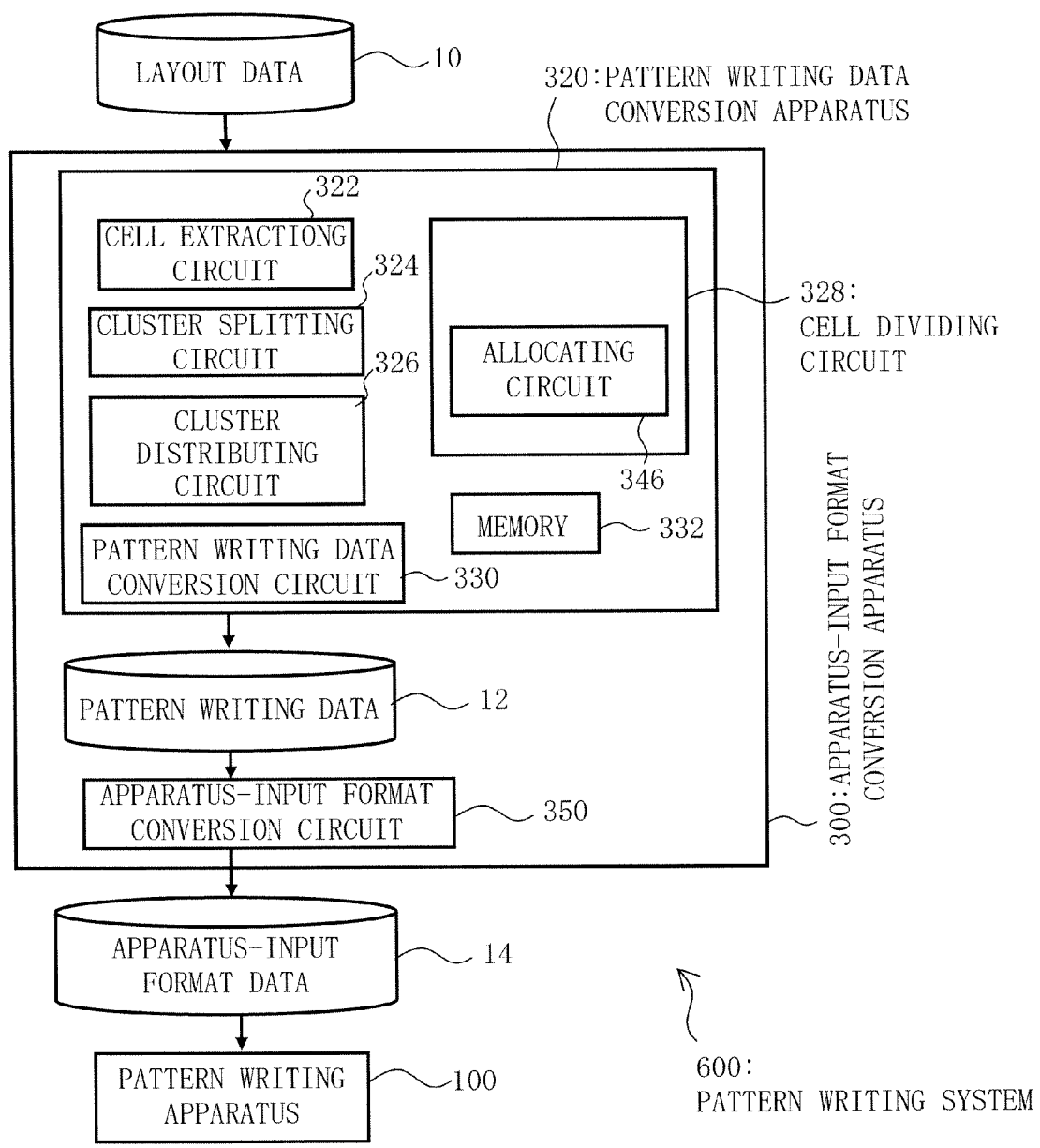
FIG. 23 is a conceptual diagram showing an example of the configuration of an apparatus-input format conversion apparatus according to the second embodiment.

FIG. 23 is a conceptual diagram showing an example of the configuration of an apparatus-input format conversion apparatus according to the second embodiment.

The hierarchical structures or the like of layout data 10 (design data) and pattern writing data 12 are the same as those in the first embodiment. An apparatus-input format conversion apparatus 300 receives the layout data 10. The apparatus-input format conversion apparatus 300 converts the layout data 10 to generate pattern writing data 12 for use in a pattern writing apparatus 100. On the basis of the pattern writing data 12, the data is converted until shot data or the like obtained by splitting a figure in a shot size to actually shoot an electron beam is obtained. With this conversion, apparatus-input format data 14 to be input to the pattern writing apparatus 100 is generated. The apparatus-input format data 14 is output to the pattern writing apparatus 100. The operations up to now are the same as those in the first embodiment.

FIG. 23 is the same as FIG. 2 except that a cell dividing circuit 328 has an allocating circuit 346 in place of the copying circuit 342 and the deleting circuit 344 in FIG. 2. In FIG. 23, constituent parts required to explain the first embodiment are shown. A pattern writing system 600 having, for example, the apparatus-input format conversion apparatus 300 and the pattern writing apparatus 100 may include other configurations.

Figure 24:
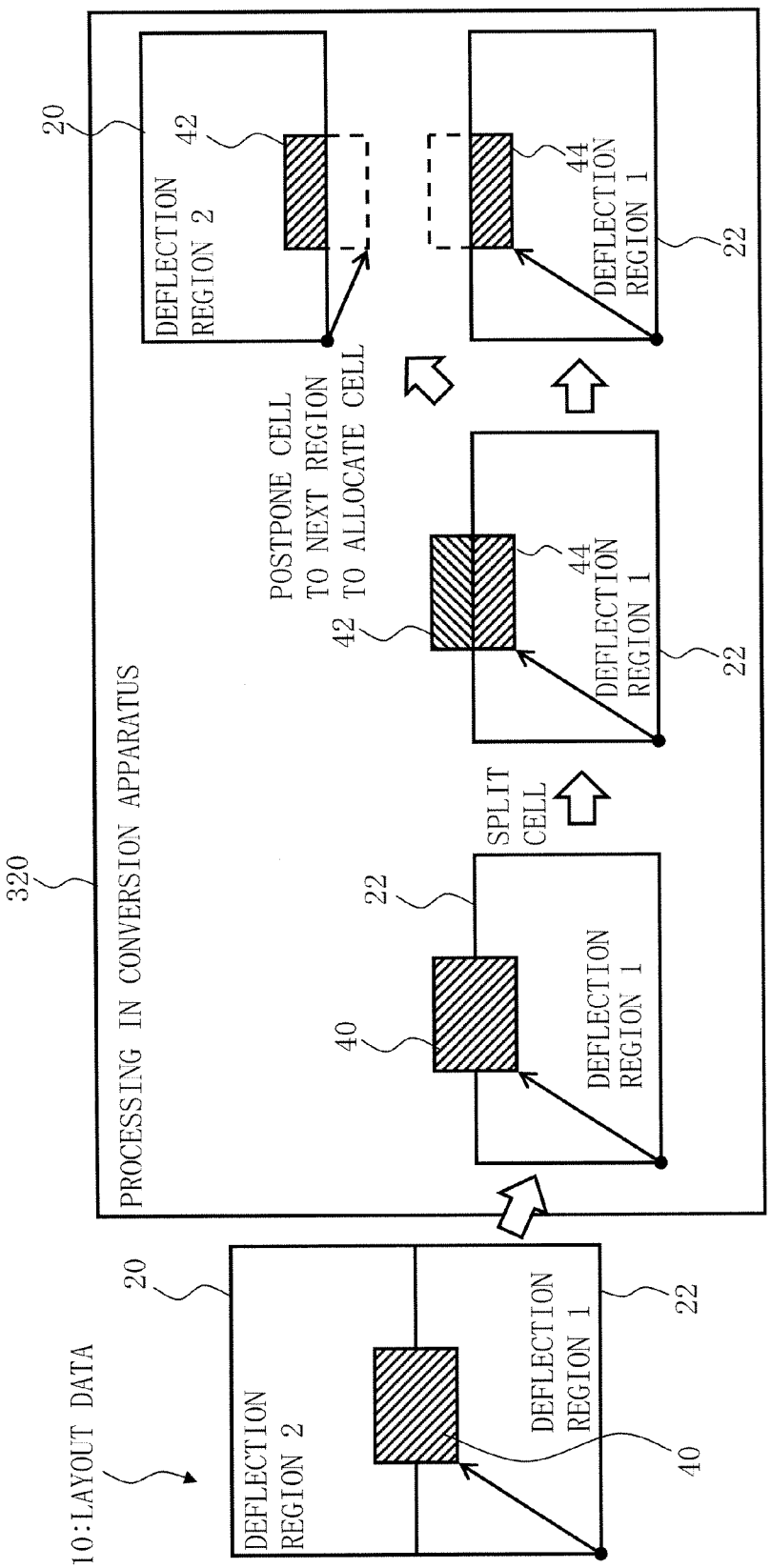
FIG. 24 is a conceptual diagram showing an example of a method of dividing a cell ranging over deflection regions according to the second embodiment.

FIG. 24 is a conceptual diagram showing an example of a method of dividing a cell ranging over deflection regions according to the second embodiment.

In FIG. 24, on the layout data 10, reference point coordinates of a cell 40 are located in a block 22 (deflection region 1). For this reason, the cell 40 is defined in the block 22. The cell 40 is laid out to an adjacent block 20 (deflection region 2). As described above, on the stage of the layout data 10, the cell 40 is not split and the layout data 10 is input to the pattern writing data conversion apparatus 320. On the basis of the input layout data 10, a partial cell pattern 44 which can be deflected in a self region and a partial cell pattern 42 serving as the other portion are generated by a block 22 serving as a deflection region on a side on which the cell 40 is defined. In the block 22 serving as the deflection region in which the cell 40 is defined, the partial cell pattern 42 of the cell 40, which is the cell pattern portion which cannot be deflected in the self region, is cut and split. The partial cell pattern 42 which is the split cell pattern portion is allocated as a partial cell pattern in the block 20 to which the partial cell pattern 42 ranges. In this manner, of the data of the ranging pattern, the cell pattern portion which cannot be deflected is postponed to the ranging deflection region to make it possible to divide a cell ranging in the pattern writing data conversion apparatus 320 to respective deflection regions. As a result, the pattern need not be split by the layout data 10. In this manner, not in formation of the layout data 10, in formation of the pattern writing data 12, partial patterns of respective regions can be generated when there is a pattern ranging over a plurality of deflection regions. This will be described in detail.

In S102 in FIG. 22, the pattern writing data conversion apparatus 320, as an input step, receives the layout data 10. The layout data 10 includes a cell ranging over a plurality of deflection regions.

In S104 in FIG. 22, a cell extracting circuit 320, as a cell extracting step, extracts a cell defined in a self region for each block from the layout data 10.

In the second embodiment, as in the first embodiment, a pattern writing region is divided into frames 18 serving as a plurality of stripe-shaped regions each having a width W at which deflection can be performed by a deflector, as shown in FIG. 6. When a pattern is written in a region of the adjacent frames 18 by the pattern writing apparatus 100, the region which exceeds a region which can be changed by the deflector of the pattern writing apparatus 100, and thus, the stage of the pattern writing apparatus 100 is moved. This allows the stage to be consequently moved to a region which can be changed by the deflector. Each of the frames 18 is further divided into a plurality of blocks. FIG. 22 shows a case in which, when a cell defined in a self region in the block 22 located at block coordinates (3, 4) is extracted, the cell 40 is laid out to range over the regions of a frame 18a and a frame 18b which require to move the stage of the pattern writing apparatus 100. Specifically, the cell 40 is defined in the block 22 being in contact with a boundary of the frame 18b. The cell 40 ranges to the block 20 being in contact with a boundary of the adjacent frame 18a. The cell 40 is constituted by a pattern 17.

In S108 in FIG. 22, the cluster splitting circuit 324, as a cluster splitting step, splits the cell 40 into clusters. As shown in FIG. 8, the region of the cell 40 defined in the block 22 is split into clusters, i.e., regions of a plurality of clusters 16. The region which is split into clusters can be used at an exposure position when multiple exposure is performed in the pattern writing apparatus 100. As shown in FIG. 9, after the region is split into clusters, a process of omitting a cluster 16 including no pattern 17 is performed to make it possible to reduce an amount of data.

In S110 in FIG. 22, as a cluster distributing step serving as an example of the splitting step, the cluster distributing circuit 326 cuts a pattern portion of the ranging cell 40 which cannot be deflected in the deflection region in which the ranging cell 40 is defined. The cluster distributing step serves as an example of the splitting step.

Figure 25:
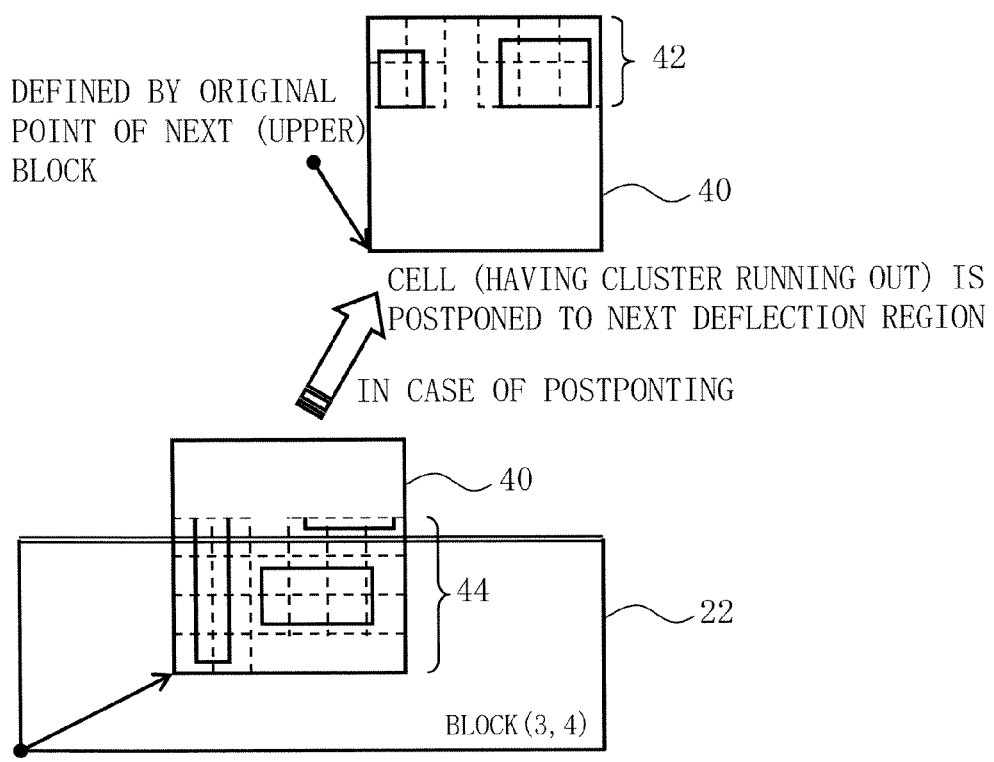
FIG. 25 is a diagram showing an example obtained by cutting a cell according to the second embodiment.

FIG. 25 is a diagram showing an example obtained by cutting a cell according to the second embodiment.

As shown in FIG. 25, with respect to the cell 40 defined in the block 22, a partial cell pattern 44 serving as a pattern portion which can be deflected in the self region and a partial cell pattern 42 serving as a pattern portion which cannot be deflected are generated. The partial cell pattern 42 is cut and split.

In S113 in FIG. 22, the allocating circuit 346 in the cell dividing circuit 328, as an allocating step, allocates a pattern portion which is cut and split by the deflection region in which the ranging cell 40 is defined as a partial pattern in the deflection region to which the cell 40 ranges. More specifically, as shown in FIG. 25, with respect to the cell 40 defined in the block 22, data of the cut and split partial cell pattern 42 serving as a pattern portion which cannot be deflected in the self region is postponed. The data is allocated as a cell pattern of the block 20 and defined as the cell pattern of the block 20. As shown in FIG. 25, a calculating process can be preferably performed by using, as a reference point of the partial cell pattern 42, the reference point of the cell 40 which has not been cut. However, the reference point is not limited to the reference point of the cell 40, and a new reference point may be set in the region of the partial cell pattern 42.

With the above configuration, it is possible to generate, on the basis of the input layout data 10, a partial pattern which can be deflected by the self region in a patterns ranging to each deflection regions of the plurality of deflection patterns. As a consequence, a cell ranging in the pattern writing data conversion apparatus 320 can be divided to the respective deflection regions without being split by the layout data 10. Therefore, the amount of the layout data 10 can be reduced.

In S114 in FIG. 22, a pattern writing data conversion circuit 330, as a pattern writing data conversion step, converts the layout data 10 into the pattern writing data 12 in units of blocks or frames 18.

In the above explanation, input/output data of the circuits are stored in a memory 332 and transmitted to other circuits through the memory 332. The data transmission is not limited to the above explanation. For example, data communication may be directly performed between the circuits. The data communication may be performed through a bus (not shown).

A main configuration of the pattern writing system according to the second embodiment and an operation thereof are the same as those in FIG. 14. A cell cutting position and a cell cutting method are the same as those in the first embodiment.

In this case, a cell pattern included in the layout data 10 is not limited to a cell pattern defined in a block in which self reference position coordinates are independently located. As described above, with respect to cell patterns which are repeatedly arranged, one cell pattern and repeat information may be defined as an array cell in one block. Now, the case of the array structure will be described.

Figure 26:
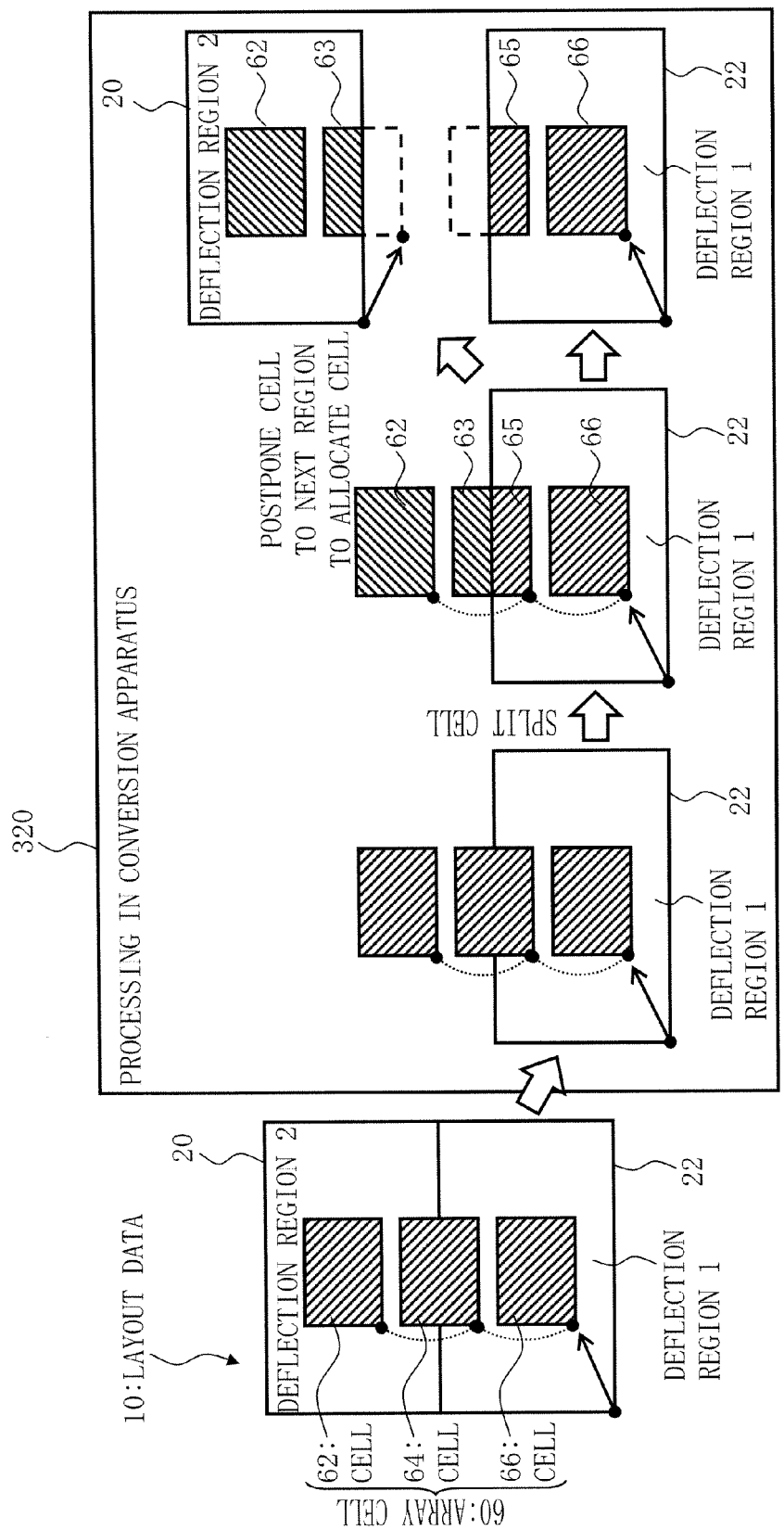
FIG. 26 is a conceptual diagram showing an example of a method of dividing a cell having an array structure ranging over deflection regions according to the second embodiment.

FIG. 26 is a conceptual diagram showing an example of a method of dividing a cell having an array structure ranging over deflection regions according to the second embodiment.

In FIG. 26, on the layout data 10, reference point coordinates of an array cell 60 constituted by a cell 62 and a cell 64 are located in the block 22 (deflection region 1). For this reason, the array cell 60 is defined in the block 22. Of the array cell 60, the cell 62 is laid out in the adjacent block 22 (deflection region 2). The cell 64 is laid out over the adjacent block 20 (deflection region 2) As described above, on the stage of the layout data 10, the array cell 60 is segmentalized without being split, and the layout data 10 is input to the pattern writing data conversion apparatus 320 while keeping the structure of the array cell 60. On the basis of the input layout data 10, of the cell 64 constituting the array cell 60, a partial cell pattern 65, a partial cell pattern 63 and a cell 62 are generated. The partial cell pattern 65 can be deflected in the self region in the block 22 serving as a deflection region on a side on which the array cell 60 is defined. The partial cell pattern 63 and the cell 62 are portions except for portions constituting the array cell 60. In the block 22, of the ranging cell 64, the partial cell pattern 63 serving as the cell pattern portion which cannot be deflected in the self region and a portion subsequent to the partial cell pattern 63 are cut and split. The partial cell pattern 63 serving as the split cell pattern portion and the cell 62 are allocated to a partial cell pattern and a cell in the block 20 serving as a ranging deflection region. In this manner, of the data of the ranging pattern, the cell pattern portion which cannot be deflected is postponed to the ranging deflection region. In this manner, the cell ranging in the pattern writing data conversion apparatus 320 can be divided to respective deflection regions. For this reason, the layout data 10 can be formed while keeping the array structure without unnecessarily splitting the cell by the layout data 10. As a result, in addition to an increase in amount of data to divide the cell to the partial cell patterns of the layout data 10, an increase in amount of data caused by decomposing the array structure can be avoided. The respective steps are the same as those in FIG. 22.

As described above, data of a ranging pattern (cell) of a plurality of deflection regions is partially cut, and thereafter, a pattern portion which cannot be deflected in a self region is postponed to make it possible to divide the cell ranging in the pattern writing data conversion apparatus 320 to respective deflection regions. Consequently, the cell need not be split on the stage of the layout data 10. This allows an amount of the layout data 10 to be reduced. As a result, time required for transferring the data to the pattern writing data conversion apparatus 320 can be shortened.

Third Embodiment

A third embodiment is the same as the second embodiment in the following point. That is, after data of a ranging pattern (cell) of a plurality of deflection regions is partially cut, a pattern portion which cannot be deflected in a self region is postponed to allocate the pattern portion to the ranging deflection region, thereby dividing the cell ranging in the pattern writing data conversion apparatus 320 to the respective deflection region. In this case, in the third embodiment, description will be given with respect to a method of storing data of a cut pattern portion which cannot be deflected in a self region in a storage device serving as a buffer for respective ranging deflection regions prepared in advance. As a position where a ranging pattern is cut and separated, positions in various configurations can be applied as in the first embodiment.

Figure 27:
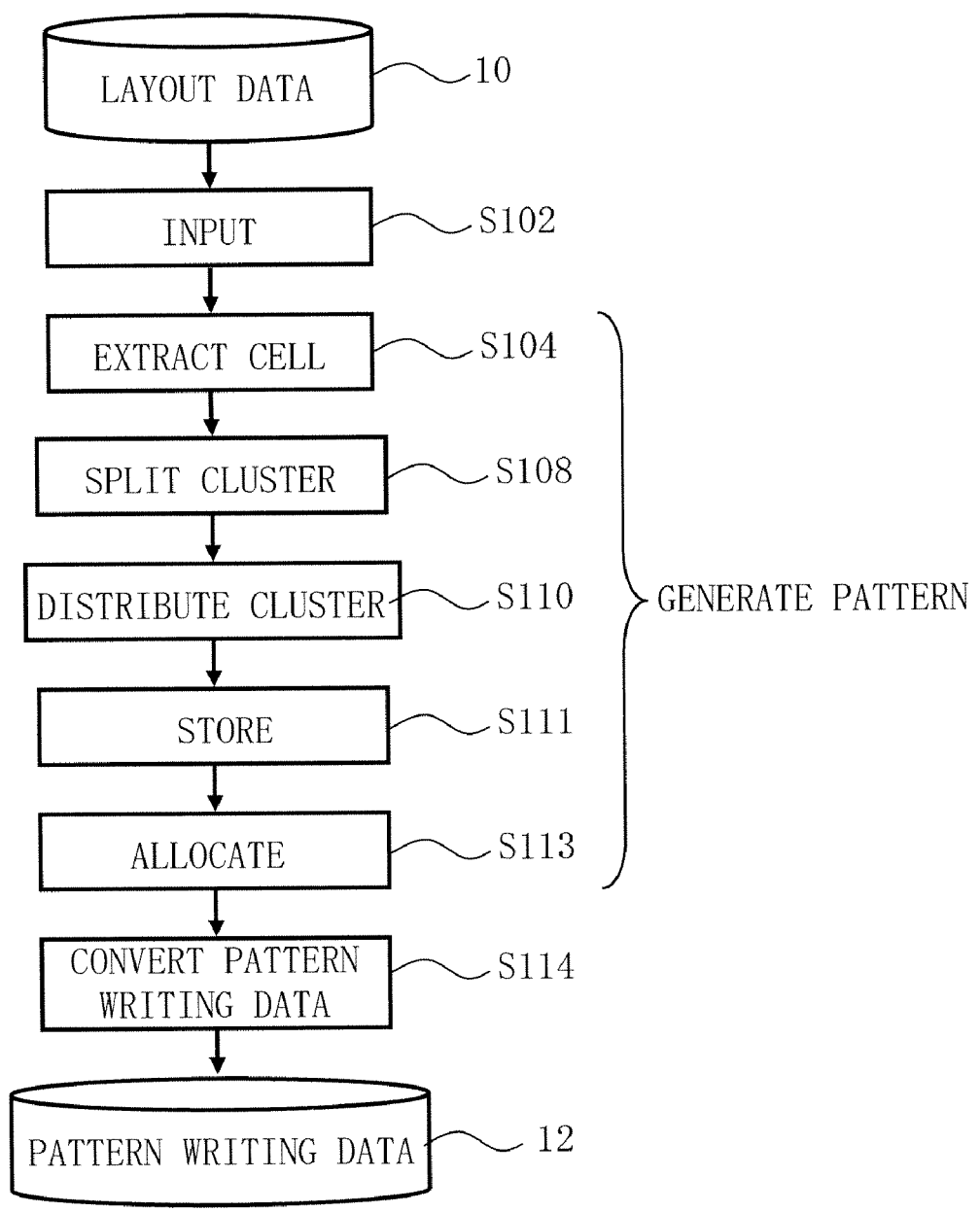
FIG. 27 is a flow chart showing main steps of a method of forming electron beam pattern writing data according to a third embodiment.

FIG. 27 is a flow chart showing main steps of a method of forming electron beam pattern writing data according to the third embodiment.

In FIG. 27, a process for verifying electron beam pattern writing data performs a series of steps including an input step (S102), a cell extracting step (S104), a cluster splitting step (S108), a cluster distributing step (S110), a storing step (S111), an allocating step (S113) serving as a part of the pattern generating step, and a pattern writing data converting step (S114). These steps are the same as those in FIG. 22 except for the added storing step (S111).

Figure 28:
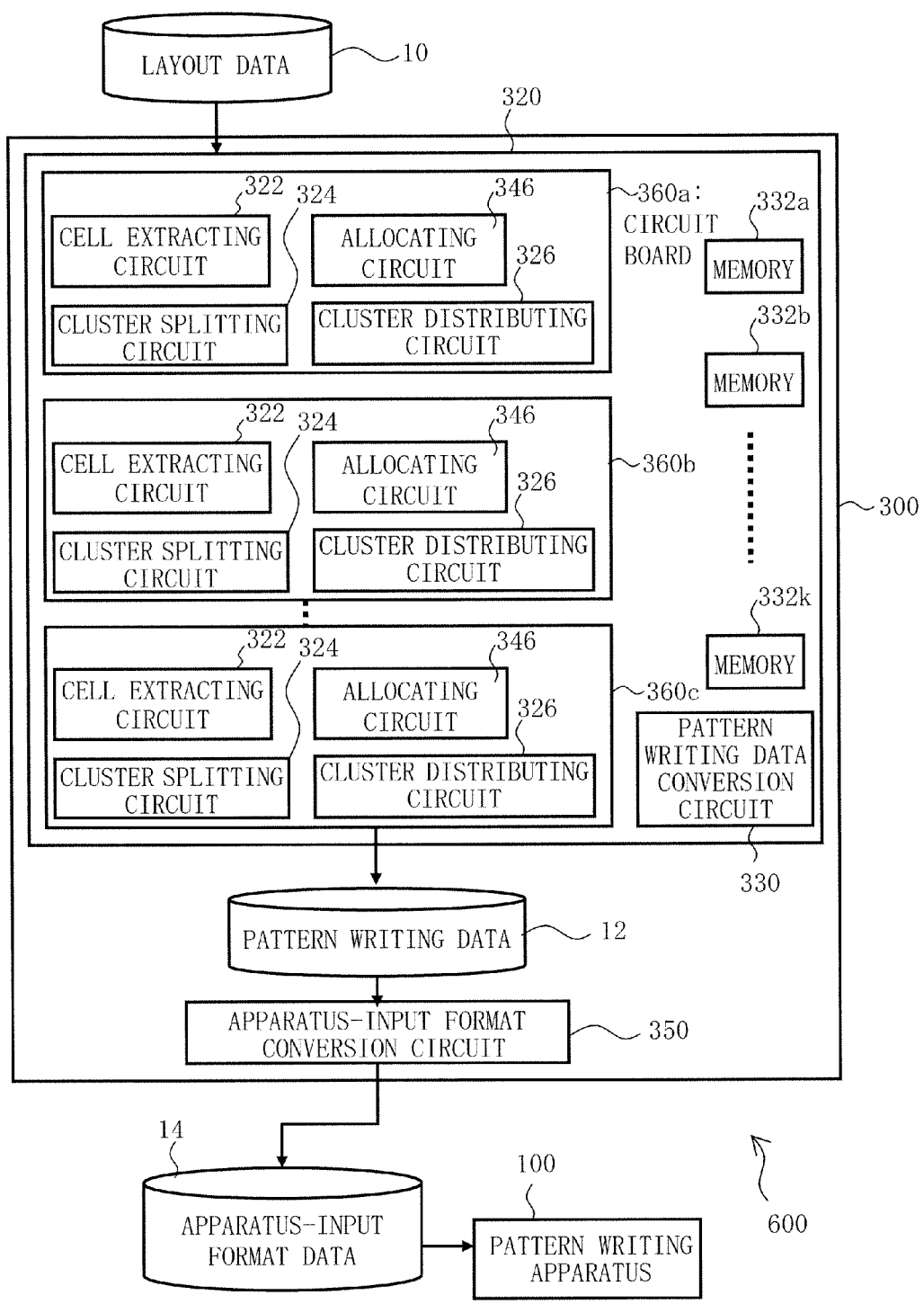
FIG. 28 is a conceptual diagram showing an example of the configuration of an apparatus-input format conversion apparatus according to the third embodiment.

FIG. 28 is a conceptual diagram showing an example of the configuration of an apparatus-input format conversion apparatus according to the third embodiment.

The hierarchical structures or the like of layout data 10 (design data) and pattern writing data 12 are the same as those in the first embodiment. An apparatus-input format conversion apparatus 300 receives the layout data 10. The apparatus-input format conversion apparatus 300 converts the layout data 10 to generate pattern writing data 12 for use in a pattern writing apparatus 100. On the basis of the pattern writing data 12, the data is converted until shot data or the like obtained by splitting a figure in a shot size to actually shoot an electron beam is obtained. In this manner, apparatus-input format data 14 to be input to the pattern writing apparatus 100 is generated. The apparatus-input format data 14 is output to the pattern writing apparatus 100 as in the first embodiment.

In FIG. 28, the pattern writing data conversion apparatus 320 includes a plurality of circuit boards 360, a plurality of memories 332, and a pattern writing data conversion circuit 330. Each of the circuit boards 360 has a cell extracting circuit 322, a cluster splitting circuit 324, a cluster distributing circuit 326, and a allocating circuit 346. FIG. 28 is the same as FIG. 2 or FIG. 23 except for the pattern writing data conversion circuit 330. In FIG. 28, constituent parts required to explain the third embodiment are shown. A pattern writing system 600 having, for example, the apparatus-input format conversion apparatus 300 and the pattern writing apparatus 100 may include other configurations.

Figure 29:
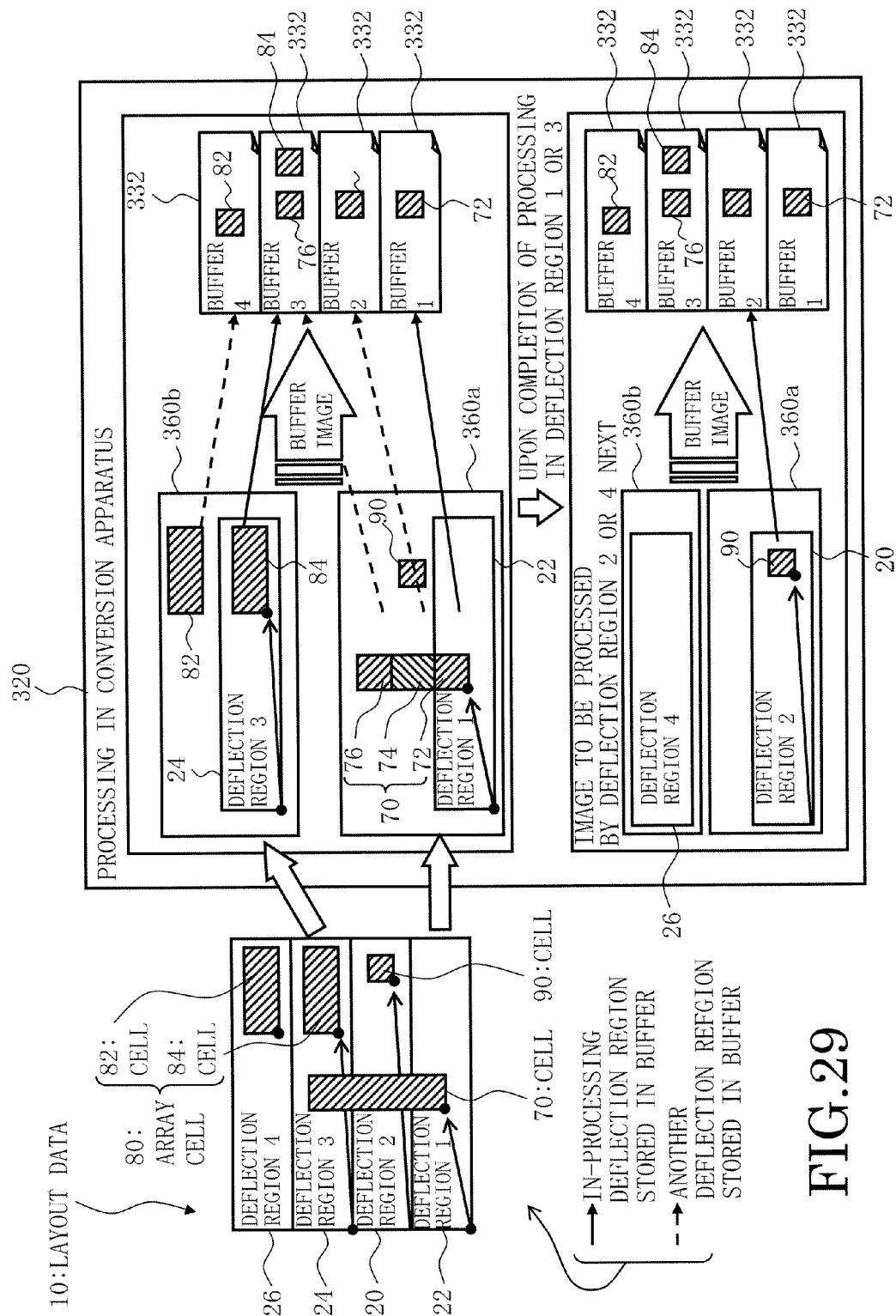
FIG. 29 is a conceptual diagram showing an example of a method of dividing a cell ranging over deflection regions according to the third embodiment.

FIG. 29 is a conceptual diagram showing an example of a method of dividing a cell ranging over deflection regions according to the third embodiment.

In FIG. 29, on the layout data 10, reference point coordinates of a cell 70 are located in a block 22 (deflection region 1). For this reason, the cell 70 is defined in the block 22. The cell 70 is laid out over a block 20 (deflection region 2) serving as an example of an adjacent deflection region and a block 24 (deflection region 3) serving as an example of a deflection region adjacent to the block 20. Reference point coordinates of an array cell 80 constituted by a cell 82 and a cell 84 are located in the block 24. For this reason, the array cell 80 is defined in the block 24. Of the array cell 80, the cell 82 is laid out in a block 26 (deflection region 4) serving as an example of a deflection region adjacent to the block 24. Since reference point coordinates of a cell 90 are located in the block 20, the cell 90 is defined in the block 20.

S102 to S110 in FIG. 27 are the same as those in the second embodiment. On the stage of the layout data 10, the cell 70 and the array cell 80 are input to the pattern writing data conversion apparatus 320 while keeping the structures of the cell 70 and the array cell 80 without being split. In this case, the steps S102 to S110 in the third embodiment are different from those in the second embodiment in that parallel processing can be performed because the plurality of circuit board 360 (a, b, . . . , n) are arranged. FIG. 29 shows, as an example, a case in which parallel processing is performed by two circuit boards 360a and 360b.

In S111 in FIG. 27, as a storing step, data of split pattern portions are stored in memories 332 serving as buffers for deflection regions. In FIG. 29, processing is first performed to the block 22 and the block 24 when the configuration includes two circuit boards 360.

The cell 70 defined in the block 22 on the circuit board 360a is split to generate a partial cell pattern 72 which can be deflected in a self region, a partial cell pattern 74 ranging to the block 20, and a partial cell pattern 76 ranging to the block 24. Data of the partial cell pattern 72 is stored in the memory 332 serving as a buffer 1 for the block 22. Data of the partial cell pattern 74 is stored in the memory 332 serving as a buffer 2 for the block 20. Data of the partial cell pattern 76 is stored in the memory 332 serving as a buffer 3 for the block 24. In parallel to processing in the circuit board 360a, with respect to the array cell 80 defined in the block 24 on the circuit board 360b, there are generated the cell 84 serving as an element of the array cell 80 which can be deflected in the self region and the cell 82 serving as an element of the array cell 80 ranging to the block 26, to split the cell 82. Data of the cell 84 is stored in the memory 332 serving as the buffer 3 for the block 24. Data of the cell 82 is stored in the memory 332 serving as a buffer 4 for the block 26.

When the configuration includes two circuit boards 360, processing to the block 20 and the block 26 is performed upon completion of processing of the circuit boards 360a and 360b. Since the cell 90 defined in the block 20 on the circuit board 360a does not range to another deflection region, data of the cell 90 is stored in the memory 332 serving as the buffer 2 for the block 20. In the circuit board 360b, processing is not performed because of the absence of a cell defined in the block 26.

In S113 in FIG. 27, the allocating circuit 346 of each of the circuit board 360, as an allocating step, reads data of a cell from the memory 332 serving as a buffer for a deflection region to be processed by the allocating circuit 346 to allocate the data to a deflection region to be processed by the allocating circuit 346.

The plurality of memories 332 serving as buffers for deflection regions are arranged to cause the memories 332 to sequentially store data for the deflection regions therein. As a consequence, processing to the self region can be performed in parallel to the processing to the regions even though a cell ranging to the self region is defined in another region.

As described above, of data of a ranging pattern, a cell pattern portion which cannot be deflected is stored in the plurality of memories 332 serving as buffers for deflection regions to which the cell pattern portion ranges to postpone the cell pattern portion, so that a cell ranging in the pattern writing data conversion apparatus 320 can be divided to the deflection regions. As a result, the cell need not be split in the layout data 10. This allows an amount of the layout data 10 to be reduced. Consequently, time required for transferring the data to the pattern writing data conversion apparatus 320 can be shortened. Furthermore, processing time can be shortened by the parallel processing.

As described above, according to at least one of the embodiments, the number of cells arranged in layout data can be suppressed. This allows the amount of the layout data 10 to be reduced. More specifically, an amount of layout data on a further upstream side can be reduced. Since the number of cells which can be expressed by an array increased, an amount of the layout data 10 can be reduced. Since the amount of the layout data 10 can be reduced, a consumption of a disk space of a storage device such as a magnetic disk drive can be saved. Since the amount of the layout data 10 can be reduced, time required for transferring data to the pattern writing apparatus 100 can be shortened. When there is a process to be processed before data is input to a pattern writing apparatus, processing time (data access time or the like) of the process can be generally reduced because the amount of the layout data 10 can be reduced. This makes it possible to shorten time until pattern writing is started and to increase a throughput.

As described above, a pattern writing region in which a pattern is written on the basis of pattern writing data is split into a plurality of stripe-like regions. When a pattern is written in an adjacent region, a stage of a pattern writing apparatus is moved. This allows the stage to be moved to a region which can be deflected. When the ranging pattern ranges over ranges which require to move the stage of the pattern writing apparatus, it is especially advantageous that partial patterns are generated by the methods.

In the above explanation, the "circuits" and the "steps" can be constituted by a program which can be operated by a computer. Alternatively, the circuits and the steps may be realized by not only a program serving as software but also a combination of hardware and software or a combination of hardware and firmware. When the circuits and the steps are constituted by a program, the program is recorded on a record carrier body such as a magnetic disk drive, a magnetic tape device, an FD, or a read-only memory (ROM).

Figure 30:
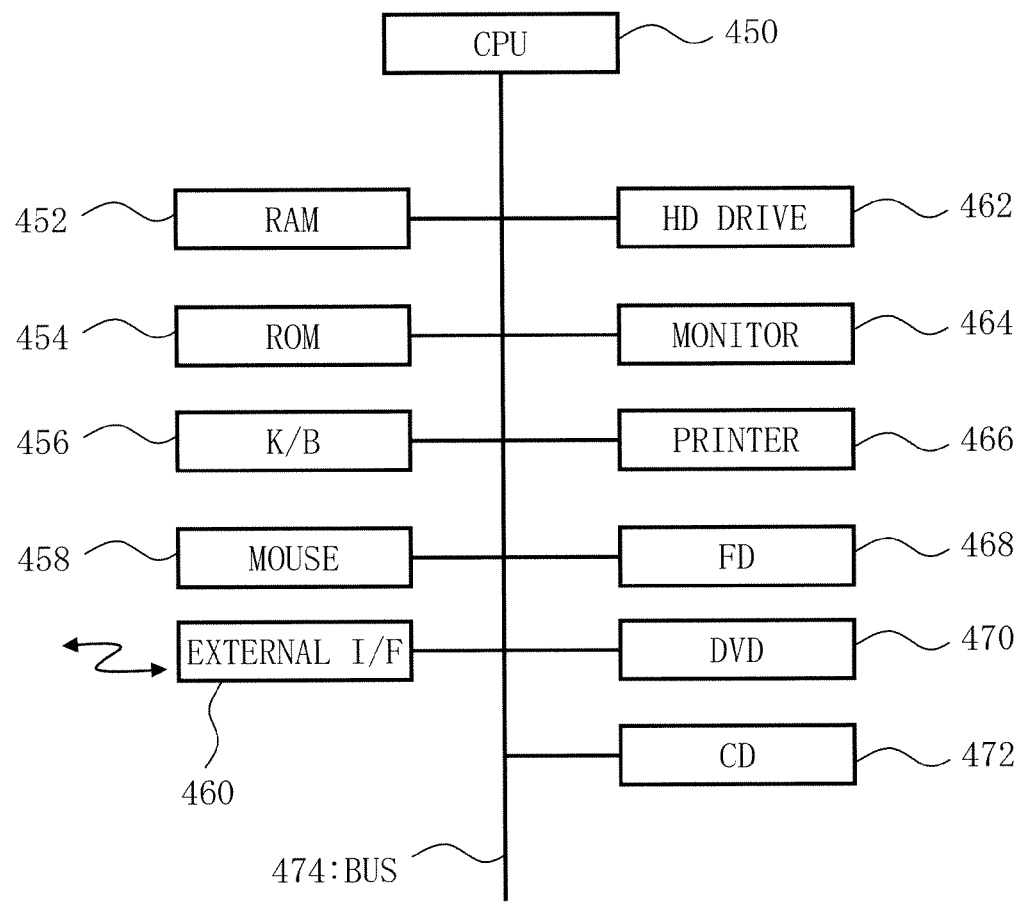
FIG. 30 is a block diagram showing an example of a hardware configuration when the apparatus is constituted by programs.
Figure 31:
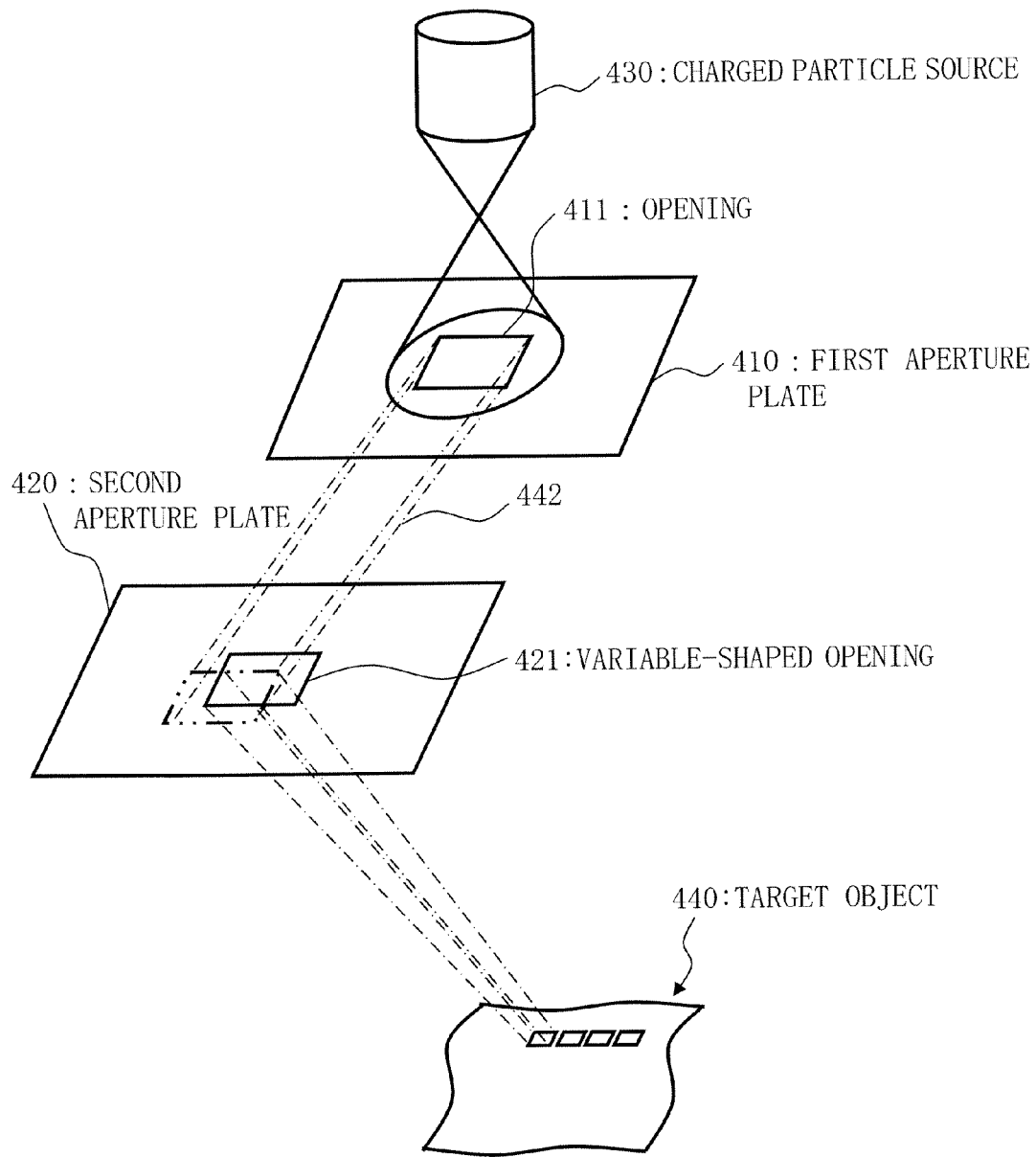
FIG. 31 is a conceptual diagram for explaining an operation of a conventional variable-shaped electron beam photolithography apparatus.

FIG. 30 is a block diagram showing an example of a hardware configuration when the apparatus is constituted by programs.

A CPU 450 serving as a computer is connected, through a bus 474, a random access memory (RAM) 452, a ROM 454, a magnetic disk (HD) drive 462, a keyboard (K/B) 456, a mouse 458, an external interface (I/F) 460, a monitor 464, a printer 466, an FD 468, a DVD 470, and a CD 472. In this case, the RAM 452, the ROM 454, the magnetic disk (HD) drive 462, the FD 468, the DVD 470, and the CD 472 are examples of a storage device. The keyboard 456, the mouse 458, the external interface (I/F) 460, the FD 468, the DVD 470, and the CD 472 are examples of input means. The external interface (I/F) 460, the monitor 464, the printer 466, the FD 468, the DVD 470, and the CD 472 are examples of output means.

The embodiments have been described with reference to the concrete examples. However, the present invention is not limited to the concrete examples.

Parts such as an apparatus configuration and a control method which are not directly required for the explanation of the present invention are omitted. However, a necessary apparatus configuration or a necessary control method can be properly selected and used. For example, although a configuration of a control unit for controlling the pattern writing apparatus 100 is omitted in the above description, a necessary configuration of such a control unit is properly selected and used, as a matter of course.

All methods of forming charged particle beam pattern writing data which can be properly changed in design by a person skilled in the art, all programs to execute the methods, or all apparatus for forming charged particle beam pattern writing data are included in the spirit and scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming pattern writing data to write a predetermined pattern from layout data of a circuit by using a charged particle beam while deflecting the charged particle beam, comprising:
 inputting the layout data including a pattern ranging over a plurality of deflection regions;
 generating a partial pattern which can be deflected in a self region in the ranging pattern for each of the plurality of deflection regions on the basis of the input layout data; and
 converting layout data including a partial pattern for each of the deflection regions into charged particle beam pattern writing data to output the charged particle beam pattern writing data.

2. The method of forming pattern writing data according to claim 1, wherein
 the ranging pattern is defined as a pattern of any one of the plurality of deflection regions, and
 when the partial pattern is to be generated, data of the ranging pattern is copied to a ranging deflection region of the plurality of deflection regions, and in each of the deflection regions after the copying, a pattern portion running out of a position where deflection can be performed in the self region is deleted.

3. The method of forming pattern writing data according to claim 2, wherein
 the ranging pattern is separated at a boundary of the deflection region, and one of the separated patterns is deleted.

4. The method of forming pattern writing data according to claim 2, wherein
the boundary of the deflection region is set inside a boundary at which deflection can be actually performed with a predetermined width, and
the ranging pattern is separated at a predetermined position set within a range having the predetermined width and extending from the boundary of the deflection region, and one of the separated patterns is deleted.

5. The method of forming pattern writing data according to claim 2, wherein
the ranging pattern is virtually split into a plurality of small regions, and
the ranging pattern is separated at a boundary of any one of the plurality of small regions, and one of the separated patterns is deleted.

6. The method of forming pattern writing data according to claim 2, wherein
the ranging pattern is separated to have an overlapping portion, and one of the separated patterns is deleted.

7. The method of forming pattern writing data according to claim 2, wherein
a cutting position is defined as attribute information in the ranging pattern, the ranging pattern is separated at the cutting position, and one of the separated patterns is deleted.

8. The method of forming pattern writing data according to claim 1, wherein
a pattern writing region in which a pattern is written on the basis of the pattern writing data is split into a plurality of stripe-shaped regions, and a stage of a pattern writing apparatus is moved when a pattern is written in an adjacent region, and
the ranging pattern ranges over regions which require to move the stage of the pattern writing apparatus.

9. A method of forming pattern writing data to write a predetermined pattern from layout data of a circuit by using a charged particle beam while deflecting the charged particle beam, comprising:
inputting the layout data which is defined as a pattern of any one of the plurality of deflection regions and which includes the pattern ranging over the plurality of deflection regions;
splitting a pattern portion running out of a position at which deflection can be performed in a self region in the ranging pattern;
allocating the split pattern portion as a partial pattern in the deflection region to which the pattern ranges; and
after the partial pattern is allocated, converting the layout data into charged particle beam pattern writing data to output the charged particle beam pattern writing data.

10. The method of forming pattern writing data according to claim 9, wherein
the ranging pattern is separated at a boundary of the deflection region, and one of the separated patterns is allocated to the deflection region to which the pattern ranges.

11. The method of forming pattern writing data according to claim 9, wherein
a boundary of the deflection region is set inside a boundary at which deflection can be actually performed with a predetermined width, and
the ranging pattern is separated at a predetermined position set within a range having the predetermined width and extending from the boundary of the deflection region, and one of the separated patterns is allocated to the deflection region to which the pattern ranges.

12. The method of forming pattern writing data according to claim 9, wherein
the ranging pattern is virtually split into a plurality of small regions, and
the ranging pattern is separated at a boundary of any one of the plurality of small regions, and one of the separated patterns is allocated to the deflection region to which the pattern ranges.

13. The method of forming pattern writing data according to claim 9, wherein
the ranging pattern is separated to have an overlapping portion, and one of the separated patterns is allocated to the deflection region to which the pattern ranges.

14. The method of forming pattern writing data according to claim 9, wherein
a cutting position is defined as attribute information in the ranging pattern, the ranging pattern is separated at the cutting position, and one of the separated patterns is allocated to the deflection region to which the pattern ranges.

15. The method of forming pattern writing data according to claim 9, further comprising
storing data of the split pattern portions in a buffer for the deflection region to which the pattern ranges.

16. The method of forming pattern writing data according to claim 9, wherein
a pattern writing region in which a pattern is written on the basis of the pattern writing data is split into a plurality of stripe-shaped regions, and a stage of a pattern writing apparatus is moved when a pattern is written in an adjacent region, and
the ranging pattern ranges over regions which require to move the stage of the pattern writing apparatus.

\* \* \* \* \*